US011705861B1

(12) United States Patent
Elkholy et al.

(10) Patent No.: US 11,705,861 B1
(45) Date of Patent: Jul. 18, 2023

(54) FAST STARTUP CRYSTAL OSCILLATOR CIRCUIT WITH PROGRAMMABLE INJECTION TIME AND ADAPTIVE STARTUP TIME TO ACHIEVE HIGH AMPLITUDE OSCILLATION

(71) Applicant: Silicon Laboratories Inc., Austin, TX (US)

(72) Inventors: Mohamed M. Elkholy, Cedar Park, TX (US); Francesco Barale, North Kingstown, RI (US); Tiago Pinto Guia Marques, Austin, TX (US); Steffen Skaug, Oslo (NO); Håkon Børli, Bekkestua (NO)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/853,070

(22) Filed: Jun. 29, 2022

(51) Int. Cl.
*H03B 5/06* (2006.01)
*H03B 5/36* (2006.01)
*H03L 7/099* (2006.01)

(52) U.S. Cl.
CPC ............... *H03B 5/06* (2013.01); *H03B 5/36* (2013.01); *H03B 5/364* (2013.01); *H03L 7/099* (2013.01); *H03B 2200/0012* (2013.01)

(58) Field of Classification Search
CPC . H03B 5/06; H03B 5/36; H03B 5/364; H03B 2200/0012; H03L 7/099
USPC ............................... 331/158, 116 FE, 16, 1 A
See application file for complete search history.

(56) References Cited

U.S. PATENT DOCUMENTS

| | | | | |
|---|---|---|---|---|
| 7,961,055 B2 * | 6/2011 | Miyata | ................... | H03L 7/0805 331/8 |
| 8,558,624 B2 * | 10/2013 | Raita | ........................ | H03K 5/19 331/173 |
| 10,367,462 B2 * | 7/2019 | Marques | ................ | H03B 5/366 |
| 10,454,420 B2 | 10/2019 | Marques | | |
| 10,491,157 B1 | 11/2019 | Pereira et al. | | |
| 10,536,115 B2 | 1/2020 | Marques et al. | | |
| 10,574,185 B2 | 2/2020 | Marques et al. | | |
| 10,601,369 B2 | 3/2020 | Marques et al. | | |
| 10,763,837 B2 * | 9/2020 | Casagrande | .............. | H03L 7/23 |

(Continued)

OTHER PUBLICATIONS

Anderton, J., "Solving the Challenge of Many Devices with Multiple Standards in the Connected Home," Qorvo White Paper, Dec. 2021, 6 pages.

(Continued)

*Primary Examiner* — Arnold M Kinkead
(74) *Attorney, Agent, or Firm* — Zagorin Cave LLP

(57) ABSTRACT

A first three state driver injects a first clock signal into a crystal through an input node during a startup phase of a crystal oscillator and a second three state driver injects a second signal into the crystal through an output node during the startup phase. The first and second signals are anti-phase signals. The crystal oscillator circuit includes a first amplifier that is used during starting up and steady-state operation and includes a second amplifier. The injection through the input and output nodes is disabled after a fixed time. After injection ends, the second amplifier is turned on if voltage on the output node has reached a desired voltage and left off otherwise. If the second amplifier is turned on, the second amplifier is turned off when the voltage on the output node reaches the desired voltage.

22 Claims, 13 Drawing Sheets

(56) References Cited

U.S. PATENT DOCUMENTS

| | | | |
|---|---|---|---|
| 2008/0042755 A1* | 2/2008 | Feygin | H03L 3/00 |
| | | | 331/2 |
| 2019/0068153 A1 | 2/2019 | Arslan et al. | |
| 2020/0014390 A1* | 1/2020 | Aboudina | H03L 7/099 |
| 2020/0343856 A1* | 10/2020 | Aboudina | H03L 7/0992 |

OTHER PUBLICATIONS

Esmaeelzadeh, H., and Pamarti, S., "A Quick Startup Technique for High-Q Oscillators Using Precisely Timed Energy Injection," IEEE Journal of Solid-State Circuits, vol. 53, No. 3, Mar. 2018, pp. 692-702.

Megawer, K., et al., "A Fast Startup CMOS Crystal Oscillator Using Two-Step Injection," IEEE Journal of Solid-State Circuits, vol. 54, No. 12, Dec. 2019, pp. 3257-3268.

Silicon Labs, "AN0016.0: Oscillator Design Considerations," Rev. 1.30, downloaded from http://www.silabs.com on May 5, 2022, 18 pages.

Silicon Labs, "UG103.16: Multiprotocol Fundamentals," Rev. 0.03, downloaded from www.silabs.com on Nov. 4, 2021, 7 pages.

Silicon Labs, "UG305: Dynamic Multiprotocol User's Guide," Rev. 1.0, downloaded from http://www.silabs.com on Oct. 1, 2021, 37 pages.

* cited by examiner

FAST STARTUP CRYSTAL OSCILLATOR CIRCUIT WITH PROGRAMMABLE INJECTION TIME AND ADAPTIVE STARTUP TIME TO ACHIEVE HIGH AMPLITUDE OSCILLATION

CROSS-REFERENCE TO RELATED APPLICATION(S)

This application relates to the application entitled "Utilizing the LC Oscillator of a Frequency Synthesizer as an Injection Source for Crystal Oscillator Startup", filed Jun. 29, 2022, naming Mohamed M. Elkholy, et. al., as inventors, and having application Ser. No. 17/853,064, which application is incorporated herein by reference.

BACKGROUND

Field of the Invention

This application relates to crystal oscillators and more particular to startup of crystal oscillators.

Description of the Related Art

Crystal oscillators (XOs) often use Pierce oscillators for their simplicity and the ease of tuning. FIG. 1 illustrates a Pierce oscillator 100 and the corresponding model 101. The crystal oscillator 100 includes a crystal 102 and tuning capacitors CL1 104 and CL2 106 used to tune the frequency of the crystal oscillator 100. The crystal has two terminals labeled XI and XO with one terminal 105 (node XI) connected to the input for the amplifier 108 and the other terminal 107 (node XO) connected to the output of the amplifier. The amplifier can take various forms. One popular and simple amplifier implementation uses a simple CMOS inverter where the resistor 110 ($R_F$) biases the amplifier at the threshold voltage of the inverter to get maximum gain. However, that approach lacks the ability to adequately control the bias current as needed by certain XO applications. Another approach uses a voltage to current amplifier with transconductance ($g_m$). The resistance $R_N$ 112 models the effective negative resistance and it is calculated as:

$$R_N = \frac{-g_m}{\omega_0^2 C_{L1} C_{L2}},$$

where $\omega_0$ is $2\pi f_0$ and $f_0$ is the resonant frequency.

In a Pierce oscillator, the oscillation happens at the parallel resonance of the crystal which can be determined by:

$$f_0 = f_S\sqrt{1+\frac{C_S}{C_T}} = \frac{1}{2\pi}\sqrt{\frac{1}{L_S C_S}}\sqrt{1+\frac{C_S}{C_T}}$$

where $f_S$ is the series resonant frequency and along with $L_S$ and $C_S$ are determined by the crystal. $C_T$ represents the motional capacitance. It represents the piezoelectric charge gained from a displacement in the crystal. $R_S$ represents the motional resistance and represents the mechanical losses in the crystal. $L_S$ represents the motional inductance and represents the moving mass in the crystal. $C_0$ is the shunt capacitance between the electrodes XI and XO and stray capacitance.

$$C_T = C_0 + C_L = C_0 + \frac{C_{L1} C_{L2}}{C_{L1} + C_{L2}}$$

The pullability of the oscillation frequency due to the variation of $C_L$ can be calculated by:

$$\frac{df_0}{dC_L} = -\frac{f_0}{2}\frac{C_S}{C_T(C_T + C_S)}$$

The startup time for building-up the oscillation is function of $|R_N|$, $R_S$ and $L_S$ and the initial and final current building-up in the crystal as shown in:

$$T_{START} \approx \frac{2L_S}{|R_N|-R_S}\ln\left(\frac{|i_{S,target}|}{|i_S(t=0)|}\right) \approx \frac{2L_S}{|R_N|-R_S}\ln\left(\frac{\omega_0 C_T |V_{XO}-V_{XI}|}{|i_S(t=0)|}\right)$$

Startup time to build-up the oscillation can be minimized by increasing $|R_N|$ and decreasing $C_T$ since $L_S$, $\omega_0$ and $R_S$ are determined by the crystal. $|i_S(0)|$ is the initial condition of the current in the crystal and is usually determined by the step response when the bias of the oscillator is applied to the crystal.

FIG. 2 illustrates a prior art implementation for a crystal oscillator 200 that tunes $C_{L1}$ and $C_{L2}$ using two capacitor banks 202 ($C_1$) and 204 ($C_2$). The control signals CP1 203 and CP2 205 adjust the capacitance to tune the capacitor banks. The build-up of oscillation in the crystal oscillator is divided into two phases: i) a startup phase with exponential build-up of oscillation; and ii) an intermediate phase with linear build-up of oscillation when $V_{XO}$ (output node of amplifier) is voltage limited.

During the startup phase a high current is applied with both transconductance amplifiers 206 and 208 being "on". The control signals CE (core enable) 210 and HGE (high gain enable) 212 are both "on" during the startup phase. The $xG_m$ amplifier has very high $g_m/I_D$ to get the maximum $g_m$ for the biasing current, thereby limiting the linearity of the amplifier and the voltage swing of $V_{XO}$. Furthermore, $C_{L1}$ (capacitor bank $C_1$ 202) and $C_{L2}$ (capacitor bank $C_2$ 204) are set to minimum during the startup phase. A compare circuit 214 detects when $V_{XO}$ (voltage of the XO node) reaches the threshold where the voltage swing is limited by the $xG_m$ amplifier 208. The compare circuit 214 is enabled (PKE is high) and the input multiplexer 216 selects the $V_{XO}$ signal (PK_SEL is high). The threshold TH1 220 is used as the threshold for the compare circuit 214 in the startup phase. When the $V_{XO}$ amplitude is higher than the TH1 threshold the output PKD 223 of the compare circuit changes to high alerting the controller 218 that the startup phase has ended.

In the intermediate phase, $C_{L1}$ and $C_{L2}$ are set to the steady-state target values. The controller 218 disables the $xG_m$ amplifier 208 by deasserting HGE 212, changes PK_SEL to 0, and changes the threshold supplied to the compare circuit to TH2 222 responsive to detecting the end of the startup phase. The core transconductance amplifier ($G_m$) 206 remains on in the intermediate phase and in steady-state. The biasing current in the intermediate phase is much higher than the steady-state biasing current to build up the current in the crystal as fast as possible in the intermediate phase by having $V_{XO}$ be almost full swing limited by the supply. During the intermediate phase, the amplitude of the voltage $V_{XI}$ on the XI node is still very low and the voltage across the crystal is almost sinusoidal with $V_{DD}/2$ amplitude ($V_{INJ}=V_{DD}/2$). An approximate time for the intermediate phase (TINT) can be calculated using this assumption:

$$T_{INT} \approx \frac{2L_S}{V_{INJ}}k\left(|i_{S,target}|-|i_S(t=t_1)|\right) \approx \frac{4L_S}{V_{XO,PP}}k|i_{S,target}|-|i_S(t=t_1)|)$$

where $|i_{S,target}|$ is the target steady-state crystal current, k is a scaling factor to compensate for the gradual change of $V_{XO}$ to rail-rail, $V_{XO,PP}$ is peak-to-peak $V_{XO}$ amplitude, and $|i_S(t=t1)|$ is the crystal current at the start of intermediate phase.

The circuit determines that the crystal current reaches $|i_{S,target}|$ by monitoring $V_{XI}$. When the compare circuit 214 determines that the $V_{XI}$ amplitude exceeds the threshold TH2 222, the intermediate phase is concluded. The Gm bias current is changed from the intermediate setting to the steady-state setting, which is determined previously using and a biasing optimization loop to find the steady-state current to keep $V_{XI}$ amplitude just above TH2. Usually, the steady-state biasing current is much lower than the current used in the startup and intermediate phases. The controller 218 enables the squaring buffer 224 by asserting the squaring buffer enable (SQE) signal 225, just after the end of intermediate phase to make the clock available to be used at CLKOUT 226.

FIG. 3 depicts a timing diagram for the crystal oscillator circuit 200. The time for the startup phase 301 usually takes double the time for the intermediate phase 303. It is important for certain applications to minimize the time required to build-up current in the startup phase to minimize the total startup time of the crystal oscillator. As seen in FIG. 3, the $V_{XO}$ amplitude is almost saturated at the end of startup phase with low output swing. The $V_{XO}$ amplitude is saturated to maximum swing at the end of intermediate phase. There are jumps in $V_{XI}$ and $V_{XO}$ signals due to changing the bias current and disabling the $xG_m$ amplifier between the startup and intermediate phase.

To improve the power supply sensitivity and to increase the supported supply voltage range, the crystal oscillator circuit 400 shown in FIG. 4 includes a low dropout (LDO) regulator 402, which is added to the crystal oscillator circuit 200 shown in FIG. 2. A regulator reference generator 404 that is directly powered from the supply voltage provides the reference and bias current for the regulator 402. Another bias generator 406 is powered from the regulated voltage Vdda, the output of the LDO regulator 402, to reduce the supply sensitivity of the generated biasing current. The control signal BE is used to enable the bias of the crystal oscillator by enabling the regulator 402, the regulator reference generator 404, and core bias generator 406. The control signal VADJ 408 controls/trims the output Vdda of the LDO regulator 402.

The CMOS inverter formed by transistors $P_1$ and $N_1$ implement the $G_m$ transconductance amplifier 206, where Vs is considered AC ground at the frequency of the oscillation due to the CD capacitor. Implementing a CMOS style transconductance amplifier doubles the value of $g_m$ for the same biasing current. Transistors $N_2$, $N_3$, $P_2$, and $P_3$ implement the high gain transconductance amplifier ($xG_m$) 208 where $N_3$ and $P_3$ are used as self-cascode devices to boost the output resistance of the transconductance amplifier 208. Furthermore, the absolute value of the threshold voltage of $N_3$ and $P_3$ are lower than $N_2$ and $P_2$. When HGE is high the switches $S_3$ and $S_5$ are "on" (closed) while switches $S_4$ and $S_6$ are "off" (open). When HGE is low, switches $S_3$ and $S_5$ are "off" while $S_4$ and $S_6$ are "on". The transistors $N_2$ and $P_2$ are wide to get the maximum available transconductance utilizing the biasing current.

A current mirror digital to analog converter (DAC) controls the bias current where the two most significant core bias bits (CB[8:7]) are implemented using a simple current mirror 412 while the rest of the bits (CB[6:0]) are implemented using a cascode current mirror 414 to improve power supply sensitivity at the steady-state biasing, which is usually low with the two MSBs disabled. During the startup phase and intermediate phase the bias current of the amplifier is high to build-up the current in the crystal as fast as possible. In steady-state, the current DAC is set to the value that will keep the amplitude of the oscillation fixed.

FIG. 5 illustrates an example of the squaring buffer 224 where the input (XI) is AC-coupled to make the performance of the squaring buffer independent of the DC voltage of the input. Similar to the core amplifier, the squaring buffer is based on a CMOS (PMOS+NMOS) design to maximize $g_m$. A current DAC 502 controls the biasing current and a decoupling capacitor 504 AC-couples the node $V_{S2}$ to ground. A Schmitt inverter 506 follows the first stage transconductance amplifier 508 to provide greater noise immunity.

A crystal at 40 MHz with $L_S=6$ mH, $C_S=2.64$ fF, $C_0=0.8$ pF, $R_S=14$ $S_2$, and $C_L=10$ pF, provides an example for calculating the startup time and startup energy of the crystal oscillator. $|I_{S,target}|=1.8$ mA peak corresponding to 663 mVpeak for the voltage across the crystal ($V_{XO}-V_{XI}$). The time $t_1$ is the time when startup phase ends (~110 μs) where $|i_S(t=t1)|=0.3$ mApeak. The DC current consumption during the startup phase is $I_{VDD,1}=1.28$ mA, and the DC current consumption during intermediate phase is $I_{VDD,INT}=1.15$ mA. The startup time ($T_{STARTUP}$) and the total charge consumed from supply during startup ($Q_{STARTUP}$) can be calculated as:

$$T_{STARTUP}=t_1+T_{INT}\approx110 \text{ μs}+50 \text{ μs}=160 \text{ μs}$$

$$Q_{STARTUP}=t_1I_{VDD,1}+T_{INT}I_{VDD,INT}\approx141 \text{ nC}+58 \text{ nC}=199 \text{ nC}.$$

While the crystal oscillator circuits of FIG. 2 and FIG. 4 provide approaches for crystal oscillator startup, further improvements in crystal oscillator startup time is desirable.

SUMMARY OF EMBODIMENTS OF THE INVENTION

Accordingly, in an embodiment a method for starting up a crystal oscillator includes injecting a first clock signal into a first node of a crystal of the crystal oscillator during a startup phase of the starting up using a first tristate driver. A second clock signal is injected into a second node of the crystal during the startup phase using a second tristate driver with the first clock signal and the second clock signal being anti-phase signals. The injecting of the first and second clock signals is disabled responsive to an end of a predetermined time period. A first amplifier circuit coupled across the first node and the second node is enabled during the startup phase and during an intermediate phase of the starting up following the startup phase. The intermediate phase ends responsive to the amplitude of a first node voltage on the first node reaching a first voltage threshold.

In another embodiment, a crystal oscillator includes an injection circuit to inject, during a startup phase for starting the crystal oscillator, a first signal into a crystal of the crystal oscillator through a first node and to inject a second signal into the crystal through a second node, the first signal and the second signal being anti-phase signals. A control circuit disables the injection circuit responsive to a passage of a predetermined period of time to stop the anti-phase signals from being injected. A first amplifier circuit is coupled across the first node and the second node and used during the startup phase and an intermediate phase. A compare circuit compares the amplitude of a first node voltage on the first node to a first voltage threshold. An end of the intermediate phase is indicated when the amplitude of the first node voltage exceeds the first threshold voltage.

In another embodiment, a crystal oscillator includes a first node to couple to a first terminal of a crystal of the crystal oscillator and a second node to couple to a second terminal of the crystal. A first three state driver injects, during a startup phase of the crystal oscillator, a first signal into the first node and a second three state driver injects during the startup phase, a second signal into the second node. The first signal and the second signal are anti-phase signals. A control circuit disables the first three state driver and the second three state driver after a predetermined period of time to thereby disable injection and cause respective outputs of the first three state driver and the second three state driver to be high impedance. A first amplifier circuit is coupled across the first node and the second node and is used during the startup phase and an intermediate phase that follows the startup phase. A second amplifier circuit is coupled across the first node and the second node and selectively used during the startup phase.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
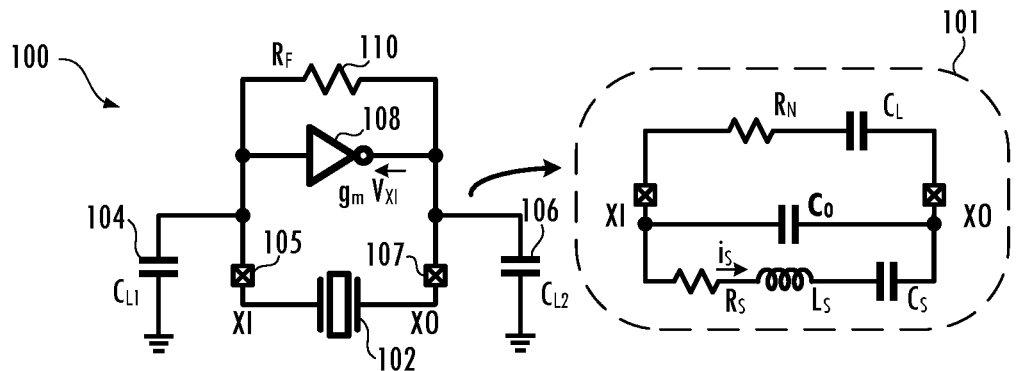
FIG. 1 illustrates a Pierce oscillator and a model.

Embodiments described herein inject a signal with the same frequency as the crystal during startup. When injecting a voltage signal across the crystal with the same frequency as the crystal, crystal current starts to build-up. The amplitude of the current in the crystal oscillator will start to grow linearly with time which can be modeled by:

$$|i_S(t)| \approx \frac{2V_{INJ}}{\pi L_S}t,$$

where $V_{INJ}$ is the voltage amplitude of the square signal across the terminals of the crystal. The equation is based on the assumption that $f_{INJ}=f_0$, which is the crystal frequency. In general, $f_{INJ}=f_0+\delta f_{INJ}$ and the growth of the amplitude of crystal current is not linear with time. An expression can be found when the quality factor of the crystal is very high ($Q=\omega_0 L_S/R_S$), injection time is much shorter than $1/\alpha$ where $\alpha=R_S/(2LS)$ and injection time is comparable to $1/|\delta f_{INJ}|$:

$$|i_S(t)| \approx \frac{2V_{INJ}}{\pi^2 L_S |\delta f_{INJ}|}|\sin(\delta f_{INJ} \times \pi \times t)|$$

The general expression is:

$$|i_S(t)| \approx \frac{4V_{INJ}}{\pi R_S}\frac{1}{\sqrt{1+(2\pi \times \delta f_{INJ}/\alpha)^2}}\sqrt{1+e^{-\alpha t}[e^{-\alpha t}-2\cos(2\pi \times \delta f_{INJ} \times t)]}$$

During injection with a signal which has a frequency error of $\delta f_{INJ}$, the amplitude of the current in the crystal builds up until it reaches a maximum then it collapses back again. The maximum can be calculated by setting $\pi \times |\delta f_{INJ}| \times T_{MAX}=\pi/2$. The equation can be used to determine the maximum acceptable $T_{INJ}$ or the maximum acceptable $|\delta f_{INJ}|$ formulated by:

$$|\delta f_{INJ}|T_{INJ} \leq \frac{1}{2}$$

A one-step injection technique for crystal oscillator startup injects the crystal with a signal for a very short duration and then uses the crystal oscillator with a low amplitude output signal. That gives a very short startup time and a very low startup energy, but the amplitude of the oscillation is not sufficient to achieve low phase noise and low supply sensitivity required for, e.g., radio frequency (RF) performance. The approach requires an oscillator to be used for injection where it is trimmed to a frequency very close to crystal oscillation frequency and has low variation with temperature and supply voltage variations. Such applications use RC-oscillators or ring oscillators due to their small area since this oscillator is only used during startup of the crystal oscillator.

Another approach for crystal startup achieves higher oscillation amplitude utilizing a four-step approach that includes two separate injection steps. In this four-step approach, an RC-ring oscillator (RC-RO) injects the crystal with differential rail-to-rail signals on the two crystal nodes coupled to the amplifier. The injection time is very short ($T_{INJ1}$~2 µs) such that it can support variation of the injection frequency by ±5000 ppm across frequency. Following the first step, a phase-locked loop (PLL) is turned on and the output from the crystal oscillator is supplied to an all-digital PLL (ADPLL) as the reference signal to the ADPLL where the RO is the oscillator in the ADPLL. In step 2, the RO locks to the reference signal (the crystal frequency) and a digital frequency control word used to achieve lock is stored for use in step 3. The ADPLL preferably has a very fast lock time ($T_{LOCK}$~6 µs). To make the locking time faster, the phase of RO should be aligned with the reference clock from the crystal at the beginning of step 2 by resetting the edges of the RO to align to the reference clock.

In step 3, the PLL is turned off and the second injection step takes place. Any variation of injection frequency in step 1 due to temperature is compensated by the digital frequency control word determined in step 2, such that the injection frequency after the PLL is at the crystal frequency f0 within an appropriate margin of error. When the PLL is turned off, the phase of the oscillator is kept the same. Since the frequency error is 0 (or close to 0) in the second injection step, the injection signals are applied to the crystal until the amplitude of current in the crystal reaches the target level. When the target level is achieved, the injection is disabled and the steady-state biasing conditions are applied to keep the oscillation amplitude constant with time in step 4. Note there is no procedure in this four-step approach for identifying that the target crystal current $|i_{S,target}|$ has been achieved, which is a drawback.

Figure 6:
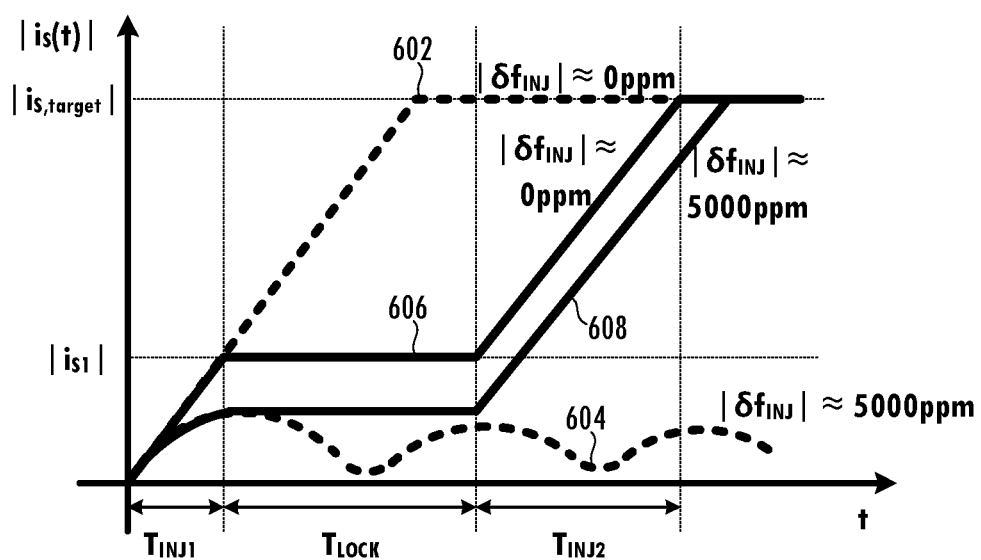
FIG. 6 illustrates expected startup times for $|\delta f_{INJ}|=0$ ppm and $|\delta f_{INJ}| \approx 5000$ parts per million (ppm).

FIG. 6 illustrates the differences between the four-step approach (with two separate injection steps) described above and the one-step injection technique described above. Dotted lines 602 and 604 show the time to reach the target crystal current $|i_{S,target}|$ in the one-step injection in the two cases of $|\delta f_{INJ}|$=0 ppm (line 602) and $|\delta f_{INJ}|$=5000 ppm (line 604). The oscillation for the one-step injection does not reach the target amplitude level in the case of one-step injection with the frequency error $|\delta f_{INJ}|$=5000 ppm. The solid lines 606 and 608 represent the four step technique with the two-step injection technique, which shows that the crystal oscillator reaches the target oscillation (line 608) even if $|\delta f_{INJ}|$=5000 ppm for TINE. For the four-step process, the total startup time is defined by ($T_{STARTUP}=T_{INJ1}+T_{LOCK}+T_{INJ2}$). $T_{INJ1}$ and $T_{LOCK}$ is almost the same for the case where $|\delta f_{INJ}|$=0 ppm and $|\delta f_{INJ}|$=5000 ppm. $T_{INJ2}$ is a little bit longer for the case of $|\delta f_{INJ}|$=5000 ppm to compensate for the difference in the current amplitude at the end of step 1. That means that there will slight increase in startup time with temperature variation.

One drawback of the two-step technique is that it uses a dedicated complete ADPLL just for starting-up the crystal oscillator, which consumes a large area in the chip. Furthermore, there is no clear methodology for determining whether the target current amplitude is achieved. That means that the oscillator design is not flexible to handle crystals of different properties.

Figure 2:
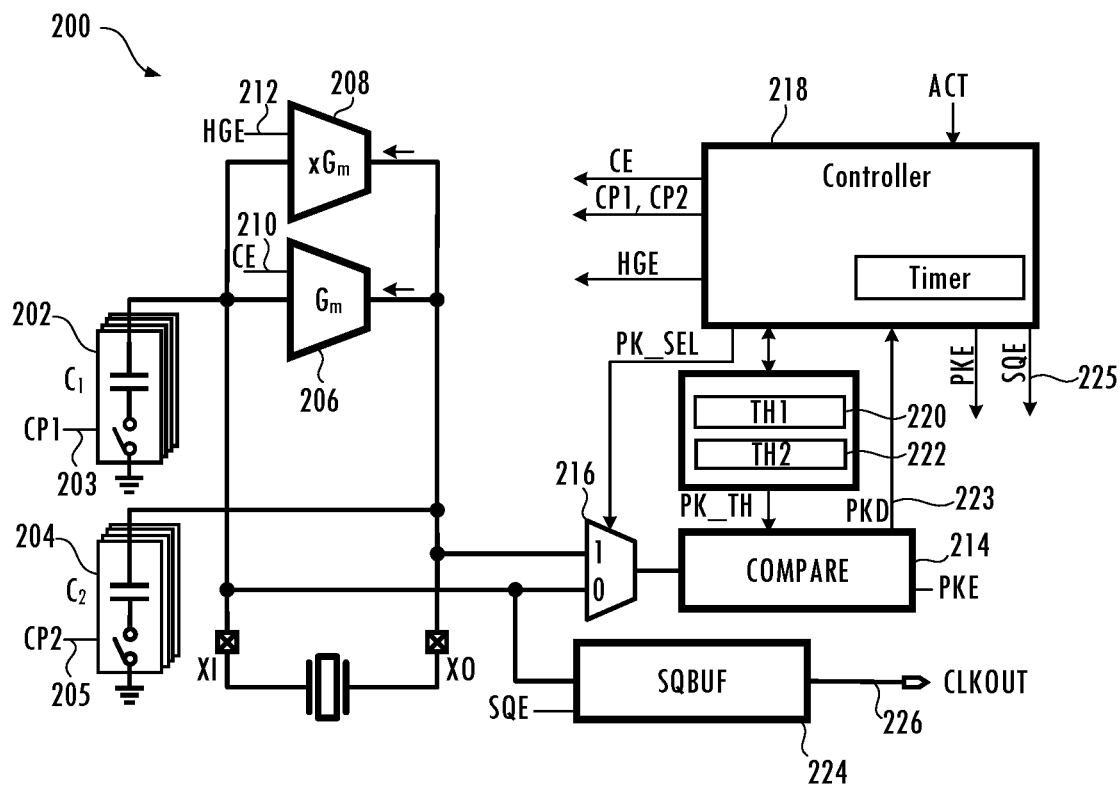
FIG. 2 illustrates a high level block diagram of a crystal oscillator circuit.
Figure 7:
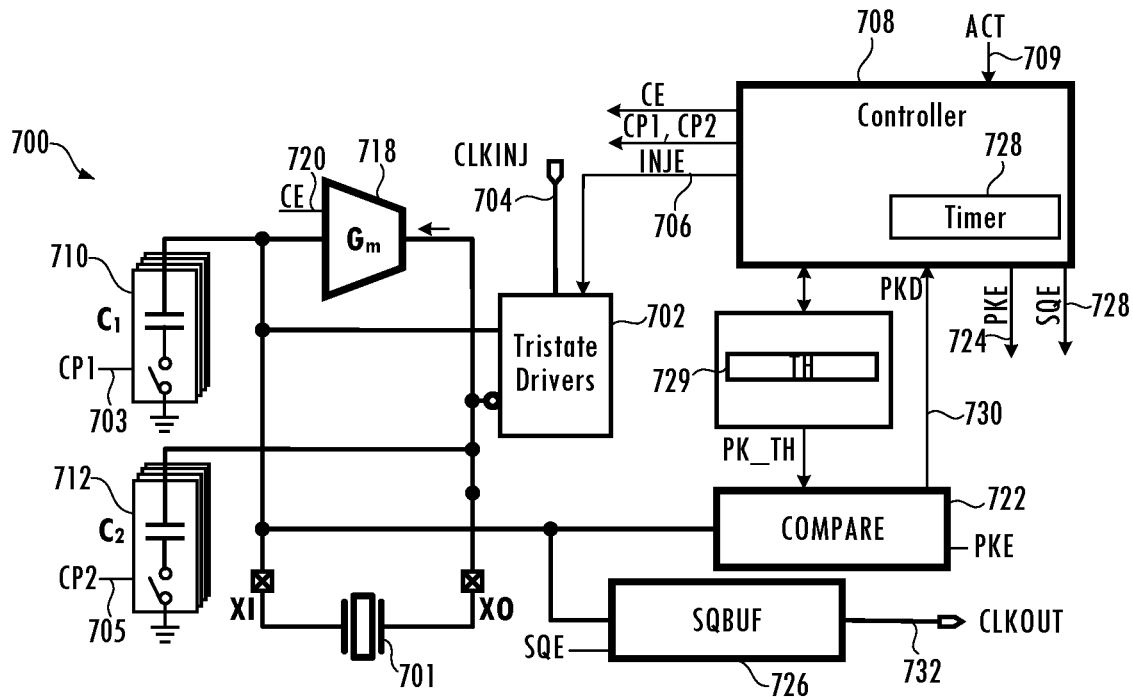
FIG. 7 illustrates an embodiment of a crystal oscillator that uses short injection signals from tristate drivers.
Figure 8:
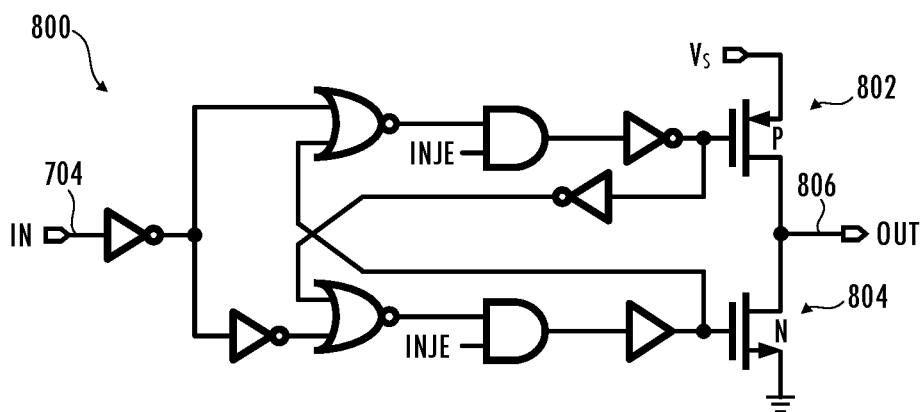
FIG. 8 illustrates an example of a tristate driver with non-overlapping switches that can be used in the crystal oscillator of FIG. 7.

Embodiments described herein reduce crystal oscillator startup time as compared to, e.g., the approach described in FIG. 2. FIG. 7 illustrates an embodiment of a crystal oscillator circuit 700 with fast injection and a high current amplifier. The crystal oscillator circuit 700 reduces the startup time required for the crystal oscillator to reach steady state. One problem with the crystal startup approach of FIG. 2 is the dependence on consuming high current for a long time to grow the $V_{XI}$ and $V_{XO}$ voltages on the XI and XO nodes exponentially. The growth rate in the FIG. 2 approach depends on the gain of the loop and the $L_S$ of the crystal. One way to improve the approach of FIG. 2 is to replace the startup phase of FIG. 2 with a fast injection phase and replace the high gain amplifier stage ($xG_m$) with tri-state drivers 702. The drivers 702 are only active for a short time (e.g., $T_{INJ}$~3 µs) and then the tri-state drivers are disabled and placed into a high impedance mode. The tristate drivers 702 include a tristate driver for the XI node and one for XO node. The driving signals are two anti-phase rail-to-rail square wave signals. The tristate drivers receive a clock injection signal (CLKINJ) 704 and a control signal INJE 706. FIG. 8 illustrates an embodiment of a tristate driver 800 that is used for both the tristate drivers 702. The tristate driver 800 receives the clock injection signal (CLKINJ) 704 and the control signal INJE 706. When the injection control signal INJE 706 is low the transistors 802 and 804 are off and the output node 806 is at high impedance. When INJE is high, the output node 806 is determined by the value on the CLKINJ signal 704. As shown in FIG. 7, the output of one of the tristate drivers is inverted to achieve the anti-phase square wave signals. In an implementation the CLKINJ signal is inverted before being supplied to the driver 800 rather than on the output.

Referring back to FIG. 7, $C_{L1}$ and $C_{L2}$ are implemented using capacitor banks $C_1$ 710 for $C_{L1}$ and capacitor bank $C_2$ 712 for $C_{L2}$. The controller 708 uses control signals CP1 703 and CP2 705 to tune the capacitor banks $C_1$ 710 and $C_2$ 712. During the startup phase a high current is applied with transconductance amplifier $G_m$ 718 being "on". The controller 708 asserts control signal CE (core enable) 720 during the startup phase to turn on the transconductance amplifier $G_m$ 718. The compare circuit 722 detects when $V_{XI}$ (voltage on the XI node) reaches the threshold (TH) 729. The compare circuit 722 compares the voltage on the XI node to the threshold TH and supplies an asserted peak detect signal PKD 730 when the comparison indicates the voltage has reached the threshold. In an embodiment the compare circuit 722 includes a peak detector circuit that receives the voltage on the XI node followed by a comparator circuit. The peak detector circuit stores the peak voltage detected on the XI node and the comparator compares that voltage to the supplied threshold. Of course, other embodiments for the compare circuit are possible. The controller 708 enables the compare circuit 722 by asserting the enable signal PKE 724. The squaring buffer (SQBUF) circuit 726 supplies a square wave output clock signal from the crystal oscillator circuit 700 when enabled. The controller 708 receives the activate signal 709, e.g., from control logic running off of another clock signal, to activate the crystal oscillator circuit.

Compared to other approaches, the startup phase of the crystal oscillator circuit 700 is very short (~3 µs) since the crystal current grows linearly with a high slope due to the injection of rail-to-rail signals on the XI and XO nodes. During the startup phase, it is better to keep $C_{L1}$ and $C_{L2}$ to a minimum value to decrease the capacitive load on the drivers to reduce their current consumption. The biasing current for the three state drivers 702 should be high to keep the driving signals into the XI and XO nodes rail-to-rail. The time of injection (Tim) can be calculated accurately using a counter and using the injected clock signal CLKINJ 704. Since embodiments require the clock to be within a certain accuracy (e.g., $|\delta f_{INJ}| < 4150$ ppm for 40 MHz crystal), $T_{INJ}$ can be determined accurately.

Once the injection is disabled, the biasing current is reduced to the level used for the intermediate phase but still high enough to have a high voltage gain much greater than 1 between $V_{XI}$ and $V_{XO}$. Although $V_{XI}$ is still small, but with the gain of the core amplifier, $V_{XO}$ grows quickly to be near rail-to-rail, as shown in FIG. 9.

Figure 9:
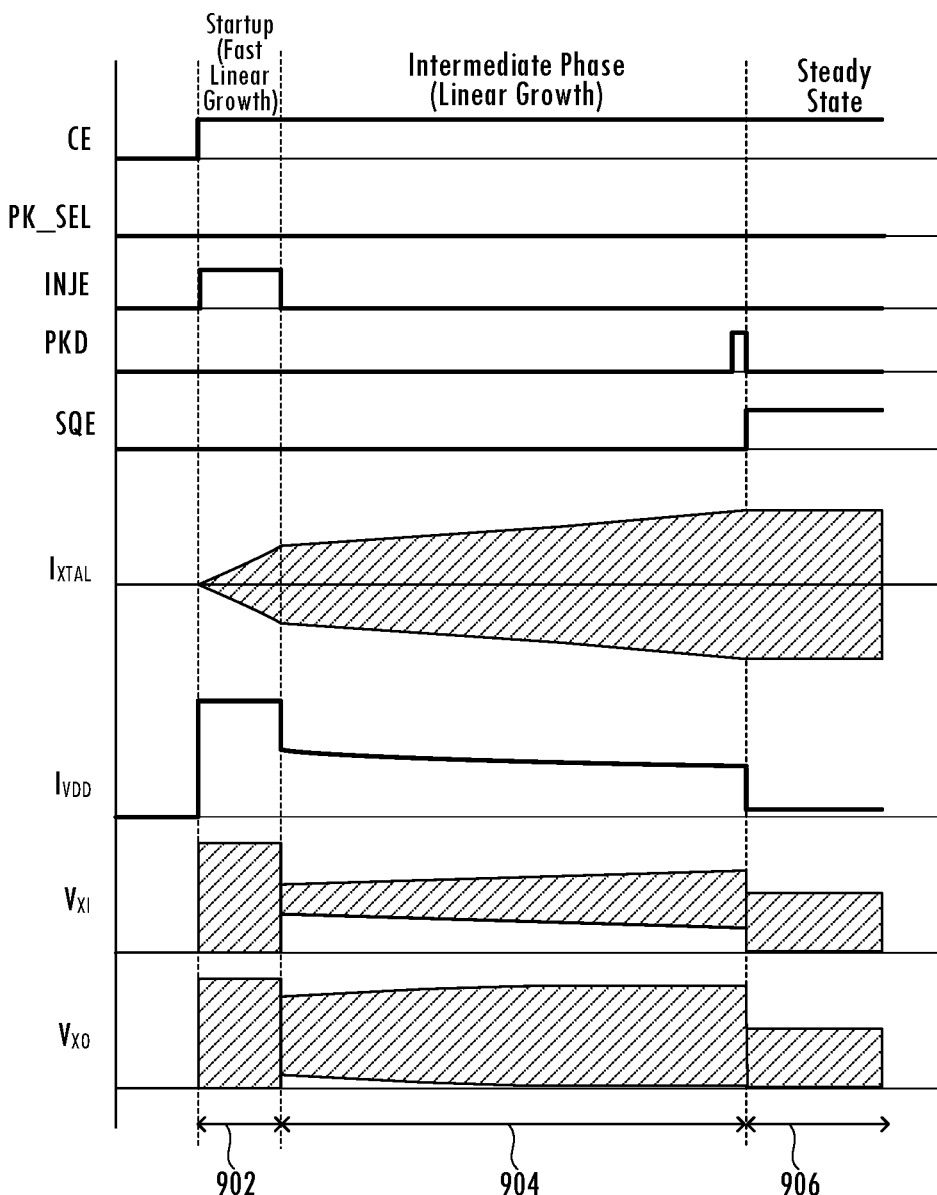
FIG. 9 illustrates a timing diagram for the crystal oscillator shown in FIG. 7.

FIG. 9 illustrates the three phases including an injection phase 902, an intermediate phase 904, and a steady-state phase 906. With reference to both FIGS. 7 and 9, to start the startup injection phase, the controller 708 asserts the CE signal 720 to turn on the transconductance amplifier Gm 718. The controller 708 also turns on the inject enable (INJE) signal 706 to enable the tristate drivers 702 at the start of the injection phase. The crystal current $I_{XTAL}$ grows linearly but quickly during the startup injection phase 902. FIG. 9 shows that $V_{XI}$ and $V_{XO}$ are near rail-to-rail during the startup injection phase 902.

The controller 708 ends the injection phase 902 based on the end of the period $T_{INJ}$ determined by the timer output from timer 728. In embodiments the injection time $T_{INJ}$ is programmable and stored in a register or other memory location accessible to the controller 708 and programmable through, e.g., a serial interface (not shown) or determined and stored in non-volatile memory during manufacturing testing. The controller deasserts INJE but keeps CE asserted at the beginning of the intermediate phase. The controller 708 applies the steady-state tuning for the tuning capacitors $C_{L1}$ and $C_{L2}$ at the beginning of the intermediate phase 904 to minimize the capacitance change between the intermediate phase and the steady-state phase. The end of the intermediate phase is determined by monitoring $V_{XI}$ and determining when $V_{XI}$ reaches a certain threshold voltage (TH) 729, which is supplied to the compare circuit 722 as the compare threshold PK_TH. When the $V_{XI}$ voltage amplitude is higher than the threshold TH, the compare circuit 722 changes the PKD signal 730 from low to high, which is sent to the controller 708. After the intermediate phase ends, the controller 708 applies the steady-state biasing condition to keep the amplitude of $V_{XI}$ and $V_{XO}$ steady with time. The controller also asserts SQE to turn on the squaring buffer 726 responsive to the beginning of the steady state phase.

The total startup time for the injection phase and the intermediate phase can be calculated as:

$$T_{STARTUP} \approx T_{INJ} + \frac{4L_S}{V_{XO,PP}} k(|i_{S,target}| - |i_S(t = T_{INJ})|)$$

$$|i_S(t = T_{INJ})| \approx \frac{2V_{DD}}{\pi L_S} T_{INJ}$$

Assume, e.g., that $T_{INJ}=3$ µs, k is a calibration factor ~3/2, $V_{XO,PP}$ is ~1.2 V, $V_{DD}$ is ~1.4 V, $L_S$ is ~6 mH, and $|i_{S,target}|=1.8$ mApeak. $|is(t=T_{INJ})|=0.446$ mApeak and $T_{STARTUP}=43.6$ µs.

A crystal at 40 MHz with $L_S=6$ mH, $C_S=2.64$ fF, $C_0=0.8$ pF, $R_S=14\Omega$, and $C_L=10$ pF, is used as an example for calculating the startup time and startup energy of the crystal oscillator circuit 700 shown in FIG. 7. An $|I_{S,target}|$ of 1.8 mApeak corresponds to 663 mVpeak for the voltage across the crystal ($V_{XO}-V_{XI}$). Assume $T_{INJ}=3$ µs and $|is(t=T_{INJ})|=0.446$ mApeak. The DC current consumption during startup phase is $I_{VDD,INJ}=2.56$ mA, and the DC current consumption during the intermediate phase is $I_{VDD,INT}=1.15$ mA. The startup time ($T_{STARTUP}$) and the total charge consumed from supply during startup ($Q_{STARTUP}$) can be calculated as:

$$T_{STARTUP}=T_{INJ}+T_{INT}\ 3\ \mu s+40.6\ \mu s=43.6\ \mu s$$

$$Q_{STARTUP}=T_{INJ}I_{VDD,INJ}+T_{INT}I_{VDD,INT} \approx 7.7\ nC+46.7\ nC=54.4\ nC,$$

which is a significant reduction in $T_{STARTUP}$ and $Q_{STARTUP}$ from the approach illustrated in FIG. 2, which were 160 µs and 199 nC, respectively.

Figure 10:
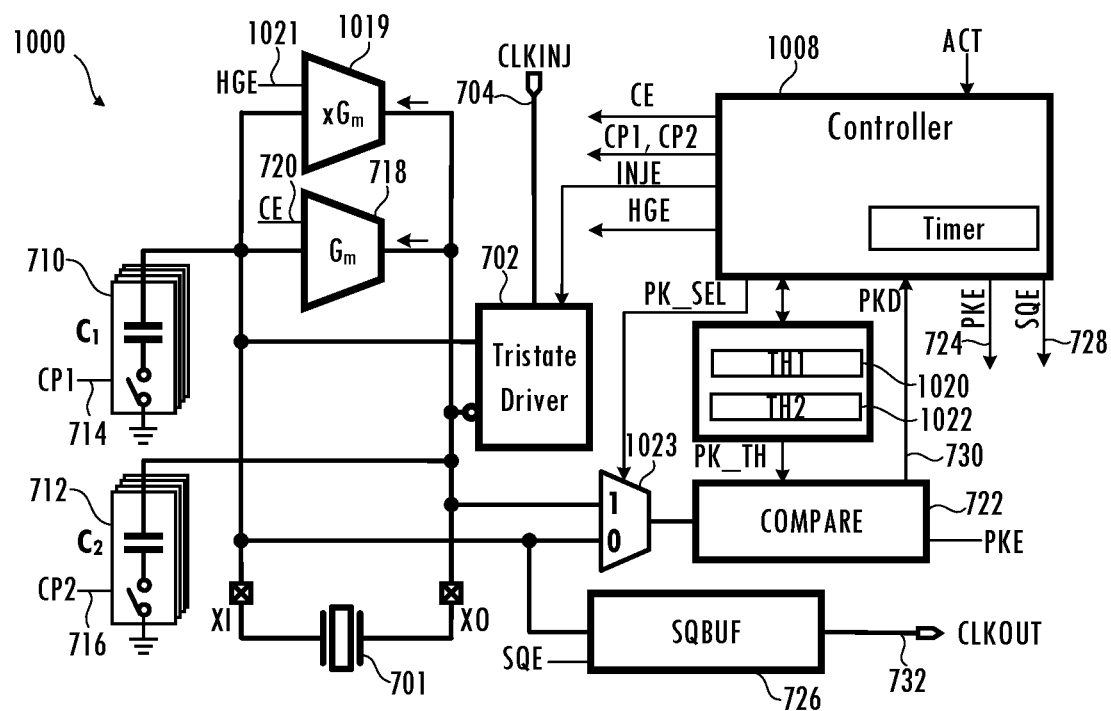
FIG. 10 illustrates an embodiment of a crystal oscillator that uses a short pulse of injected signal at startup and optionally a high gain transconductance amplifier.

FIG. 10 illustrates another embodiment of a fast startup crystal oscillator circuit 1000 with a programmable injection time and an adaptive startup time to achieve high amplitude oscillation. The embodiment illustrated in FIG. 7 saves energy and time to startup the crystal. However, the embodiment of FIG. 7 requires an accurate injection frequency in order to start in a reasonable time. In Internet-of-Things (IoT) applications, a device is powered on one time and then it can enter sleep modes multiple times. In the first powerup, the startup time/energy consumed are not very critical while the startup time/energy consumption become critical when repeatedly exiting sleep mode to perform an RF operation (either transmitting or receiving). During the first power-up of the circuit, it is possible that the injection signal is not close enough to the crystal oscillation frequency ($f_0$) ($|\delta i_{INJ}|$ is too large) to achieve an adequate startup. The dashed line 604 in FIG. 6 illustrates such an inadequate startup. FIG. 10 illustrates a crystal oscillator circuit 1000 that addresses that situation by including both the tristate drivers 702 and a high gain transconductance amplifier ($xG_m$) 1019 to provide the option of injection using the tristate drivers or use of the high gain transconductance amplifier ($xG_m$) 1019 with transconductance amplifier 718. The two transconductance amplifiers can be used in place of injection, or in addition to injection. Thus, a user can choose to use injection, use the two transconductance amplifiers, or use injection and additionally use the high gain transconductance amplifier 1019 if needed along with the amplifier 718.

Figure 3:
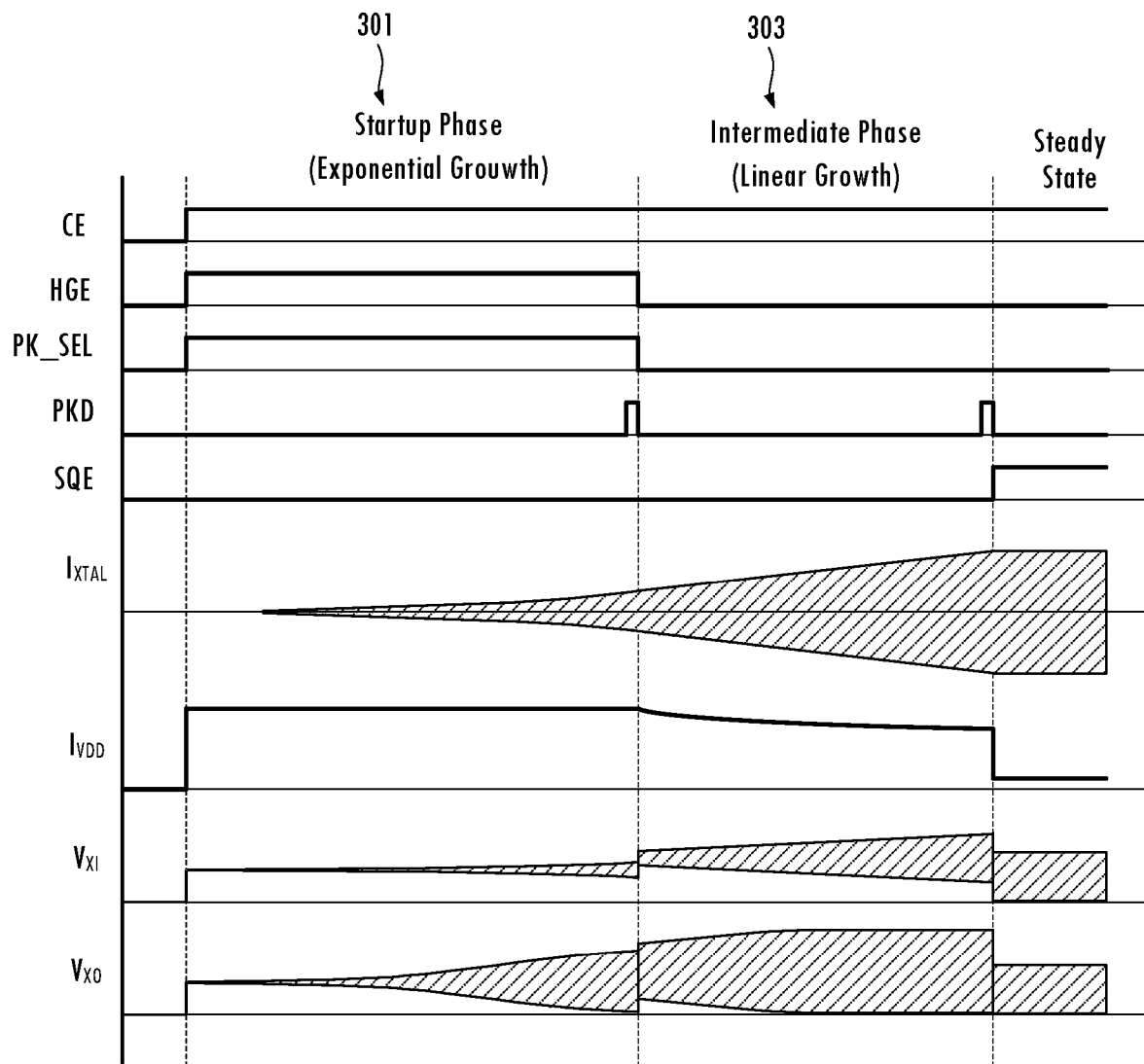
FIG. 3 illustrates a timing diagram and waveforms associated with the crystal oscillator of FIG. 2.

In FIG. 10 those elements labeled identically to the elements in FIG. 7 have the same structure and function. If the high gain transconductance amplifier 1019 is selected to be used during startup, the controller 1008 turns on both transconductance amplifiers $G_m$ 718 and $xG_m$ 1019 to cause a high current to be applied by asserting the control signals CE (core enable) 720 and HGE (high gain enable) 1021. The controller sets $C_{L1}$ and $C_{L2}$ to a minimum during the startup phase with both transconductance amplifiers enabled. The compare circuit 722 detects when $V_{XO}$ (voltage on the XO node) is greater than the threshold TH1 1020. The controller enables the compare circuit 722 by asserting the peak enable control signal PKE 724 and selects the XO input to be supplied to the compare circuit 722 from input multiplexer 1023 along with the threshold TH1 1020, which is used as the threshold for the compare circuit in the startup phase. When the $V_{XO}$ amplitude becomes higher than the TH1 threshold, the compare circuit changes the output PKD to high alerting the controller 218 that the startup phase has ended. The controller deasserts PK_SEL to select the XI node, selects TH2 1022 as the compare circuit 722 threshold input, and disables HGE to enter the intermediate phase. When the compare circuit 722 detects that the voltage $V_{XI}$ on the XI input is greater than TH2, the compare circuit asserts PKD to indicate to the controller that the intermediate phase is over and the steady state phase should begin. Thus, the circuit 1000 operates as described for FIGS. 2 and 3 when only the two transconductance amplifiers are used in the startup phase. However, when the crystal oscillator circuit 1000 operates in startup injection mode, only TH2 is used and PK_SEL is set to select the XI input. The crystal oscillator circuit otherwise operates in startup injection mode as described with relation to FIGS. 7 and 9.

The choice as to whether to operate the startup phase in a first mode using both transconductance amplifiers including the high gain transconductance amplifier 1019 during the startup phase or a second mode using current injection with tristate drivers 702 during the startup phase can be determined in one embodiment by configuring the mode during power-on based, e.g., on a value of a programmed memory location in non-volatile memory (NVM). In other embodiments, the mode selection is pin programmable.

Figure 11A:
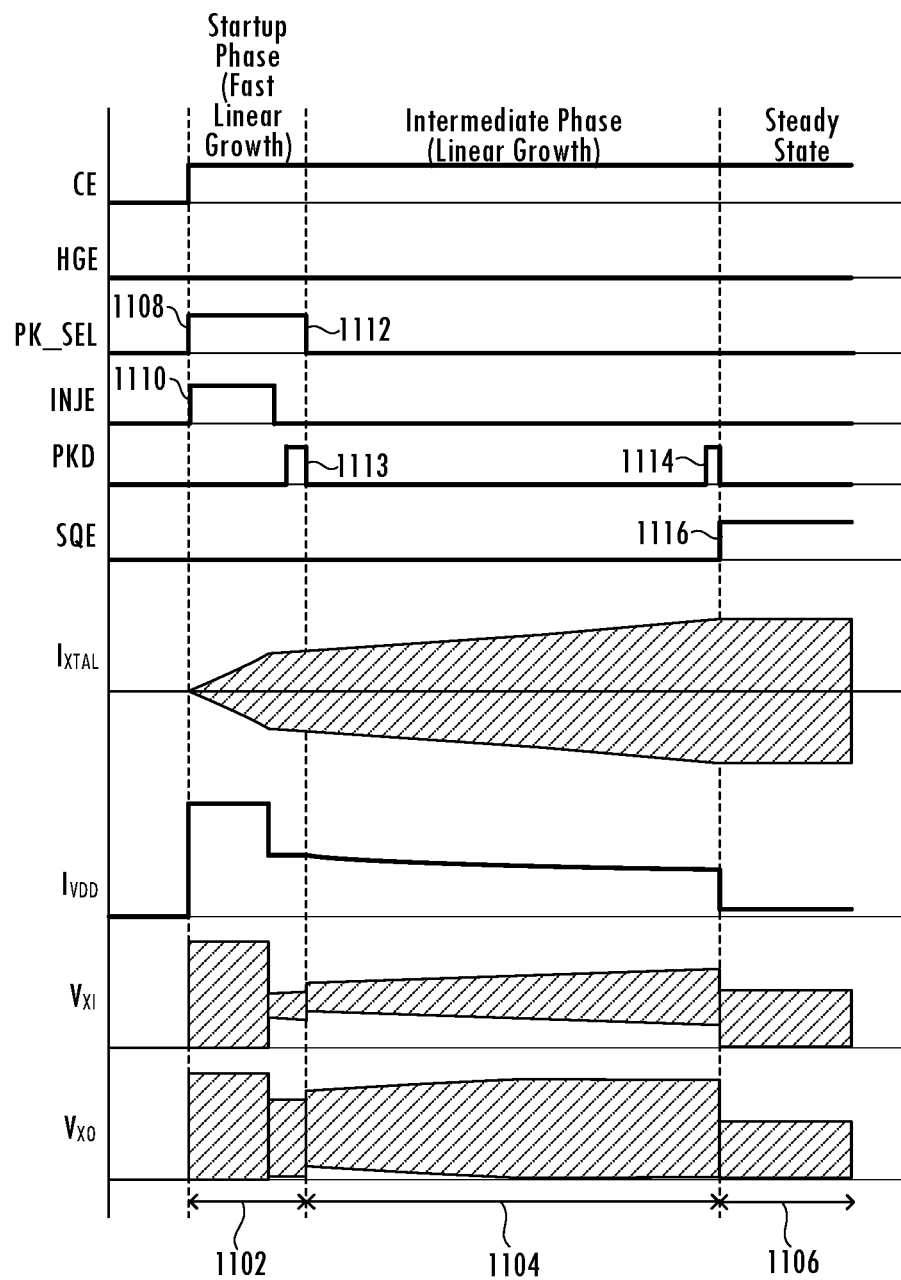
FIG. 11A illustrates a timing diagram for the crystal oscillator shown in FIG. 9 in which the high gain transconductance amplifier is not turned on after checking the voltage on the XO node.

Another embodiment provides the flexibility to use both startup approaches if conditions warrant. To provide such flexibility, the controller 1008 checks the amplitude of $V_{XO}$ after the injection time. FIG. 11A illustrates a timing diagram associated with such an embodiment. The startup phase occurs during 1102. The intermediate phase occurs during the time period 1104, and the steady state phase occurs during 1106. The $V_{XO}$ amplitude check causes the startup phase to be extended by some time (~4 μs) to check that the $V_{XO}$ amplitude on the XO node is higher than the TH1 threshold voltage. That means the selector circuit 1023 selects the XO node as the input signal to the compare circuit 722. Thus, as shown in FIG. 11, the controller asserts PK_SEL at 1108 at the beginning of the startup phase. In addition, the controller enables injection by asserting INJE at 1110. Note that the controller asserts compare circuit enable signal PKE (not shown in FIG. 11A) responsive to the end of the injection period. The threshold TH1 is supplied to the compare circuit 722 as the desired threshold. The timer 728 determines the end of the injection period, which lasts for a programmable period of time. The programmable period of time is stored in a register or other memory location accessible to the controller 1008 and programmable through, e.g., a serial interface (not shown) or determined and stored in non-volatile memory during manufacturing testing. If after the end of the injection period (indicated by INJE being deasserted) the $V_{XO}$ amplitude is high enough (above TH1), the compare circuit 722 asserts PKD 730 at 1113, and the intermediate phase 1104 begins without turning on the high gain $xG_m$ amplifier 1019. The controller deasserts PK_SEL at 1112 to select the XI input to the compare circuit and causes the threshold TH2 to be supplied to the compare circuit during the intermediate phase. The intermediate phase 1104 is the same as the intermediate phase shown in FIG. 9. When the linear growth causes $V_{XI}$ to be greater than TH2, the compare circuit asserts PKD at 1114, which indicates the end of the intermediate phase. The steady state phase begins with the squaring circuit being enabled (SQE asserted) at 1116 and steady state conditions are applied to the crystal oscillator circuit.

Figure 11B:
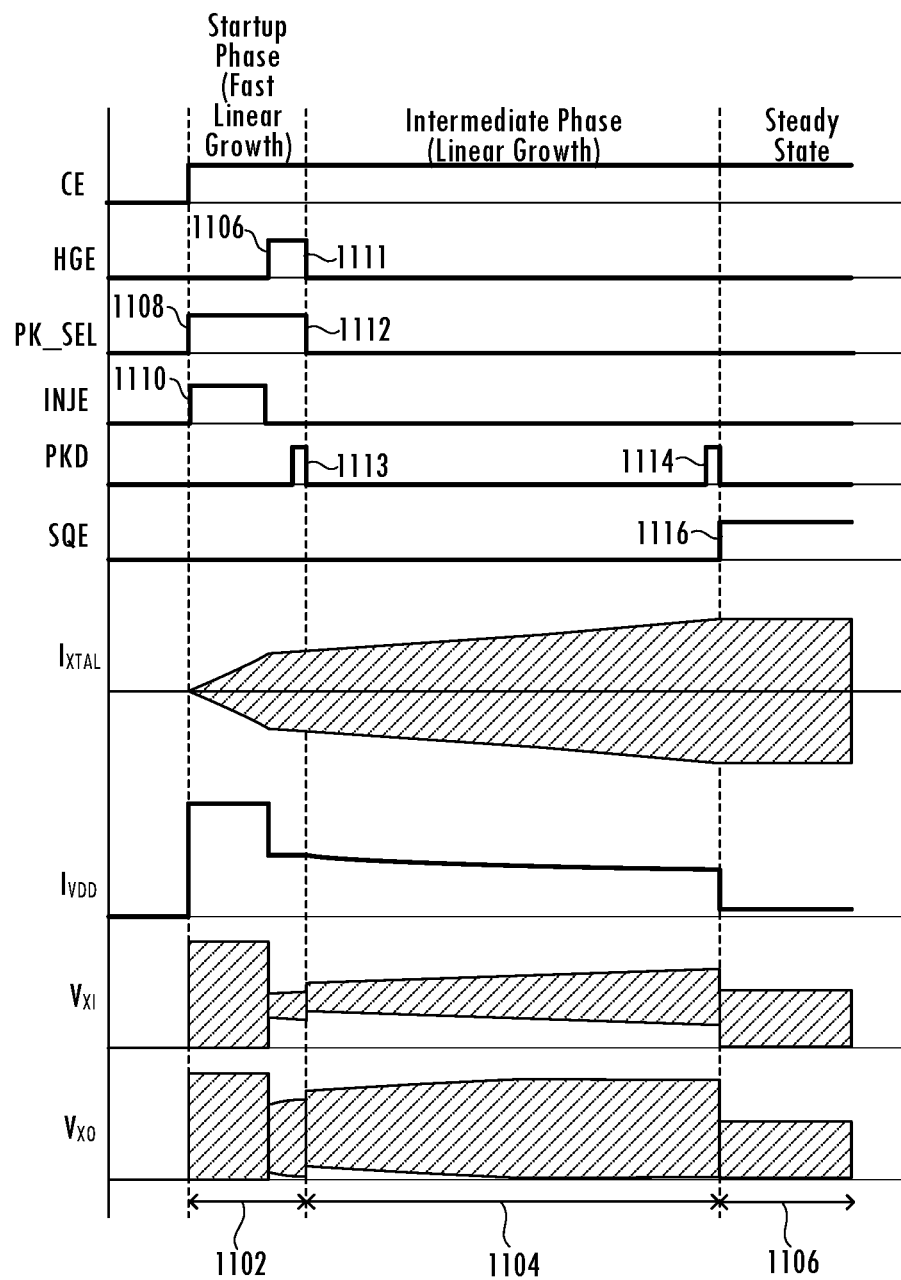
FIG. 11B illustrates a timing diagram for the crystal oscillator shown in FIG. 9 in which the high gain transconductance amplifier is turned on after checking the voltage on the XO node.

FIG. 11B illustrates the case where injection fails to result in a sufficiently high voltage $V_{XO}$ on the XO node. If the amplitude of $V_{XO}$ is not high enough to trigger the compare circuit, the controller enables high gain ($xG_m$) amplifier by asserting HGE at 1112 as shown in FIG. 11B to obtain exponential growth of crystal current amplitude until the $V_{XO}$ amplitude is higher than the threshold TH1. When $V_{XO}$>TH1, the compare circuit asserts PKD at 1113 signaling the end of the startup phase 1102. Responsive to PKD being asserted at 1113, the controller deasserts HGE at 1111 to turn off the $xG_m$ amplifier 1019. At that time PK_SEL is deasserted at 1112 to select the XI node as the input to the compare circuit and the threshold value TH2 is supplied to the compare circuit for comparison to $V_{XI}$. In addition to the impact to the length of the startup phase due to the check on $V_{XO}$, the startup time can be affected by the length of time required for HGE to be enabled (xGM on) to cause $V_{XO}$ to reach the desired threshold. Having the injection time being programmable is advantageous for optimizing the injection time based on the properties of the crystal since crystals have different properties (Ls, Cs, Rs). Injection provides for faster growth of current in the crystal compared to the intermediate phase. Therefore, having tighter control of frequency error of the injection can be used to get lower total startup time by increasing the time of injection with low frequency error.

Figure 4:
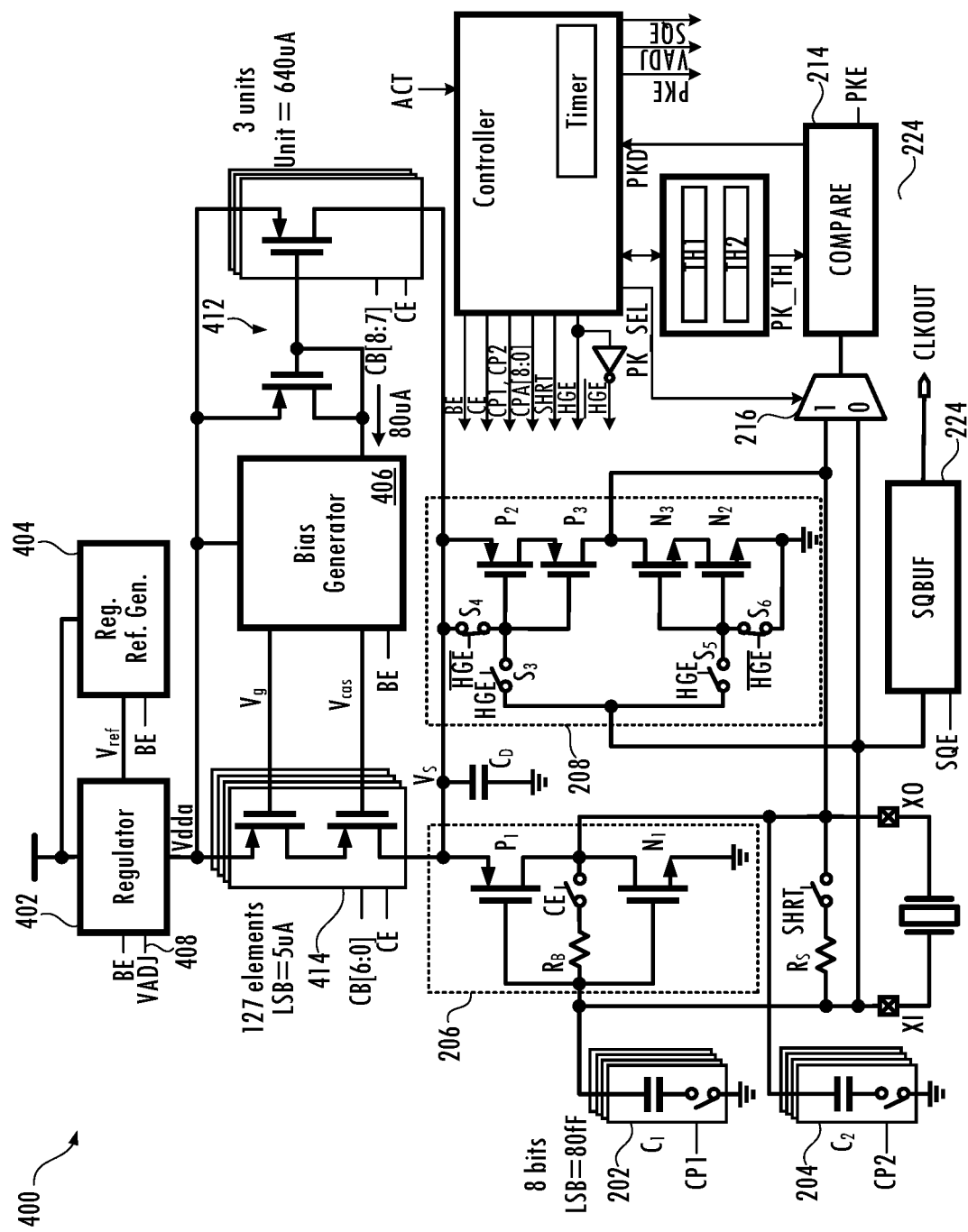
FIG. 4: illustrates a block diagram of a crystal oscillator that includes a low dropout (LDO) regulator.
Figure 12:
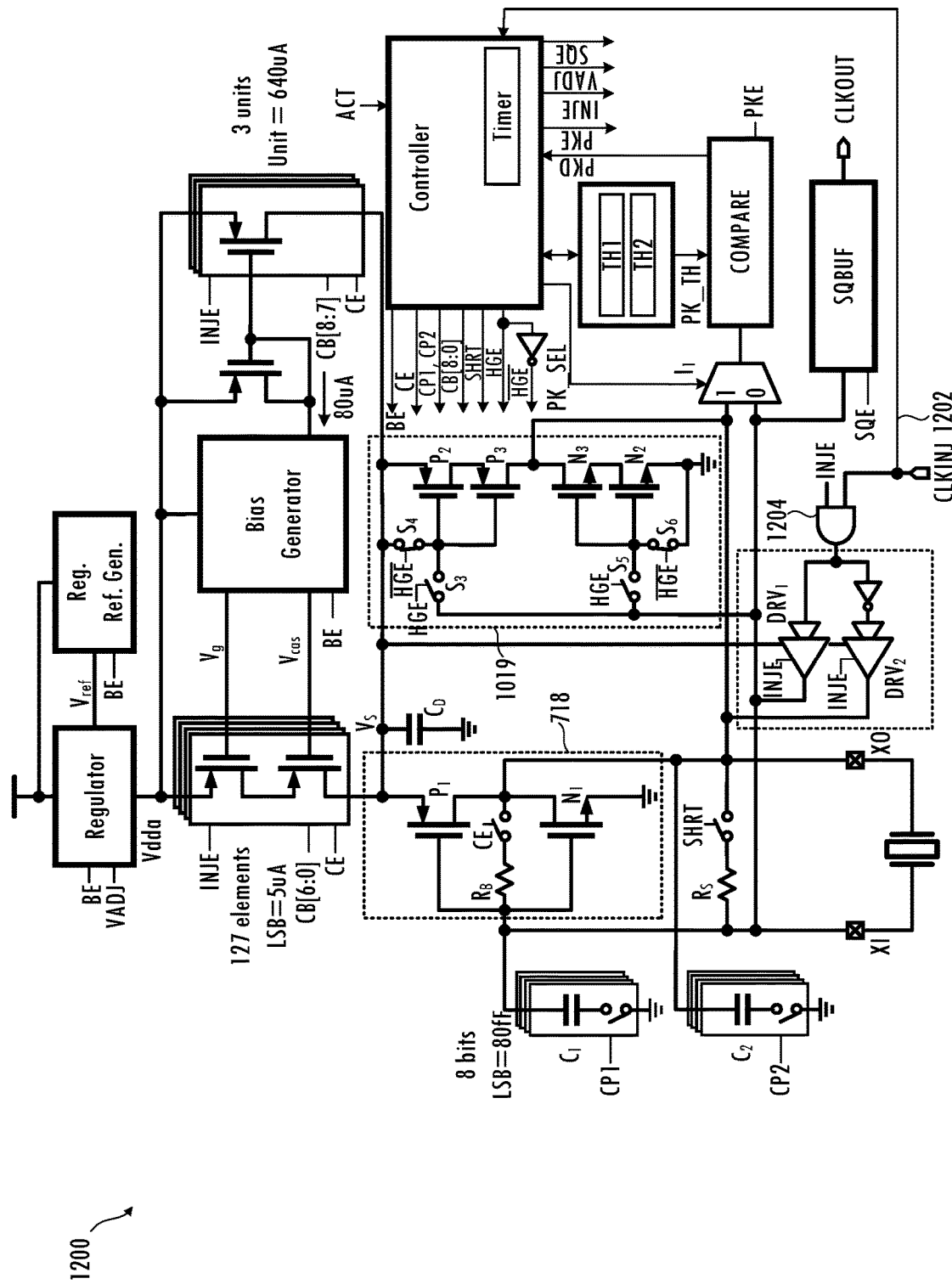
FIG. 12 illustrates an embodiment of the crystal oscillator of FIG. 10 that includes an LDO regulator.

FIG. 12 illustrates a more detailed block diagram of an embodiment of the crystal oscillator circuit 1000 shown in FIG. 10. In addition, note that the clock inject signal 1202 is passed to the controller to ensure an accurate determination for $T_{INJ}$. The various blocks in FIG. 12 have been previously described. The three state driver circuit 702 is shown to include three state driver DRV1 and three state driver DRV2, both of which are enabled by the INJE signal, which also gates the CLKINJ signal in AND gate 1204. Note that the remaining blocks in FIG. 12 have been described previously with relation to FIGS. 4 and 7, and 10.

Figure 13:
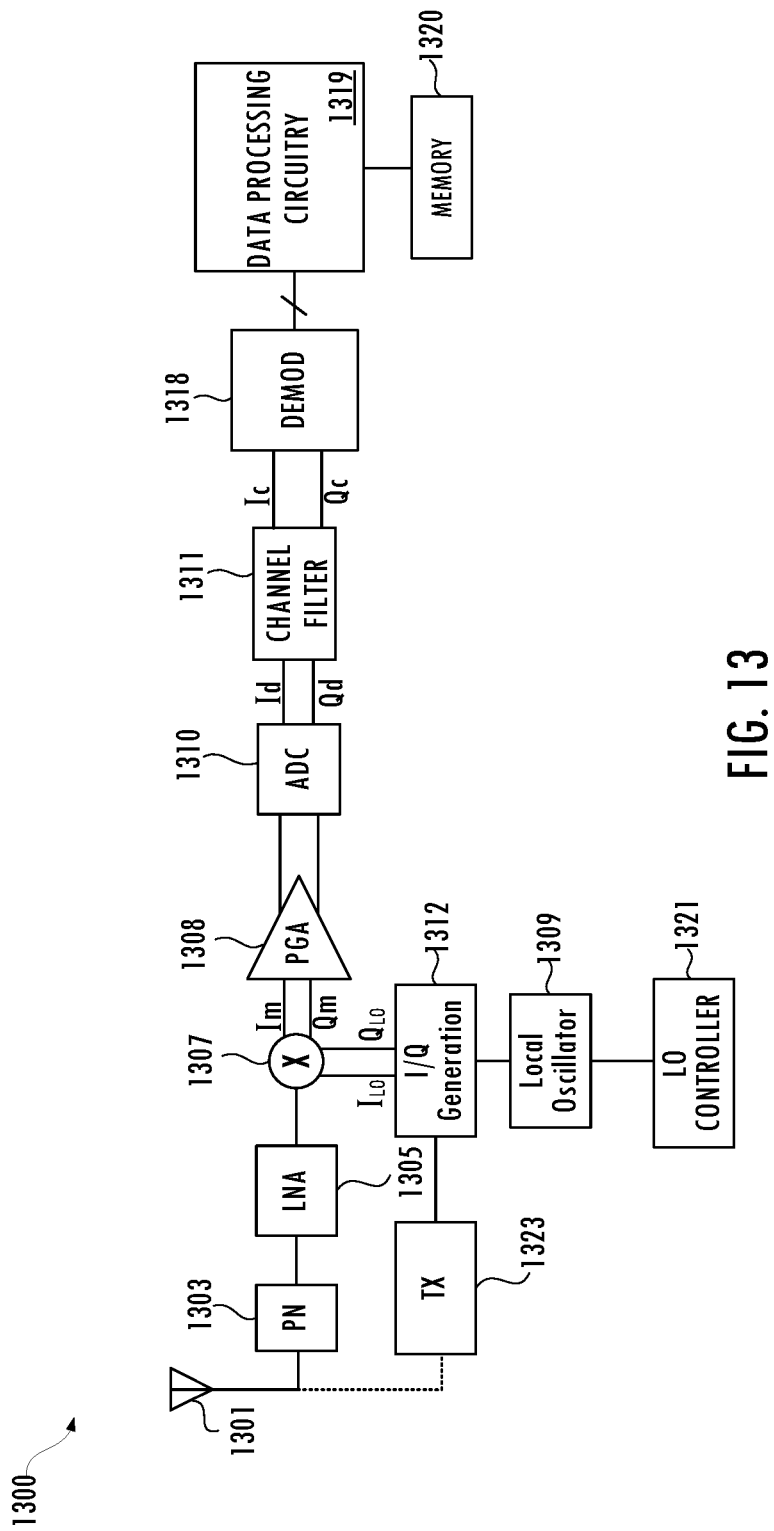
FIG. 13 illustrates a high level block diagram of a radio that includes a frequency synthesizer used for generation of a local oscillator signal that is also used during startup of the crystal oscillator.

As mentioned previously, it is undesirable to use a dedicated PLL for starting-up the crystal oscillator since such an approach consumes a large area of the integrated circuit. Accordingly, embodiments utilize an architecture in which a frequency synthesizer that is already on the integrated circuit, e.g., for radio operations, is also used as an injection source for crystal startup. That ensures that extra integrated circuit area is not dedicated solely to crystal startup. Thus, in embodiments a frequency synthesizer used during normal operation to provide a local oscillator clock signal also provides a clock injection signal for crystal startup. FIG. 13 illustrates a high-level block diagram of an embodiment of a radio 1300 that includes a frequency synthesizer to provide a local oscillator signal for transmitting/receiving. Antenna 1301 provides an $R_F$ signal to passive network (PN) 1303 that provides impedance matching, filtering, and electrostatic discharge protection. Low-noise amplifier (LNA) 1305 amplifies the signals from passive network 1303 without substantial degradation to the signal-to-noise ratio and provides the amplified $R_F$ signals to mixer 1307. Mixer 1307 performs frequency translation or shifting of the $R_F$ signals, using local oscillator (LO) signal(s) provided by I/Q generation block 1312, which is supplied from a local oscillator 1309 implemented as a frequency synthesizer. In one embodiment, the frequency synthesizer includes a phase-locked loop (PLL) having an LC voltage-controlled oscillator (VCO). A crystal oscillator provides the reference clock for the PLL during normal operation. The frequency synthesizer is described further herein. The I/Q generation block 1312 converts the local oscillator signal from local oscillator 1309 to I and Q signals for the RX mixer 1307 and the transmit (TX) mixer (not shown separately in TX block 1323).

Mixer 1307 provides the down converted output signal as a set of two signals, an in-phase (Im) signal, and a quadrature (Qm) signal to programmable gain amplifiers (PGA) 108. The Im and Qm signals are analog time-domain signals. In at least one embodiment of receiver 1300, the analog amplifiers 1308 and filters (not separately illustrated) provide amplified and filtered version of the Im and Qm signals to an analog-to-digital converter (ADC) 1310, which converts those versions of the Im and Qm signals to digital Id and Qd signals. Exemplary embodiments of ADC 1310 use a variety of signal conversion techniques (e.g., delta-sigma (or sigma-delta) analog-to-digital conversion). ADC 1310 provides digital Id and Qd signals to channel filters 1311, which provides digital filtering of the digital Id and Qd signals and provides the filtered Ic and Qc signals to the demodulator 1318. The demodulator 1318 performs demodulation of the digital Ic and Qc signals to retrieve or extract information, such as data signals, that were modulated (e.g., in a transmitter (not shown)), and transmitted to antenna 1301 as RF signals. The demodulator 1318 provides the demodulated data to the data processing circuitry 1319. In embodiments data processing circuitry 1319 performs a variety of functions (e.g., logic, arithmetic, etc.). For example, data processing circuitry 1319 uses the demodulated data in a program, routine, or algorithm (whether in software, firmware, hardware, or a combination) to perform desired control or data processing tasks. In an embodiment, the data processing circuitry includes a processor such as a microcontroller and software and/or firmware to perform the desired functions. The memory 1320 stores software and firmware for use by data processing circuitry 1319 to perform various tasks and stores data supplied to or from data processing circuitry 1319. The memory 1320 may include multiple kinds of memory in various embodiments including dynamic random-access memory (DRAM), static random-access memory (SRAM), and/or non-volatile memory (NVM), according to system needs. In addition, while the data processing circuitry can access memory 1320, in embodiments, other system components, such as LO control block 1321 can also access memory 1320, or portions thereof. In embodiments, at least some functionality of LO control block 1321 are implemented by software/firmware running on a processor in data processing circuitry 1319. FIG. 13 also shows a transmit path 1323 that utilizes the same antenna and local oscillator as the receive path. The transmit data may be sent from the memory 1320. Details of the transmit path are well known in the art and not further described herein.

Figure 14:
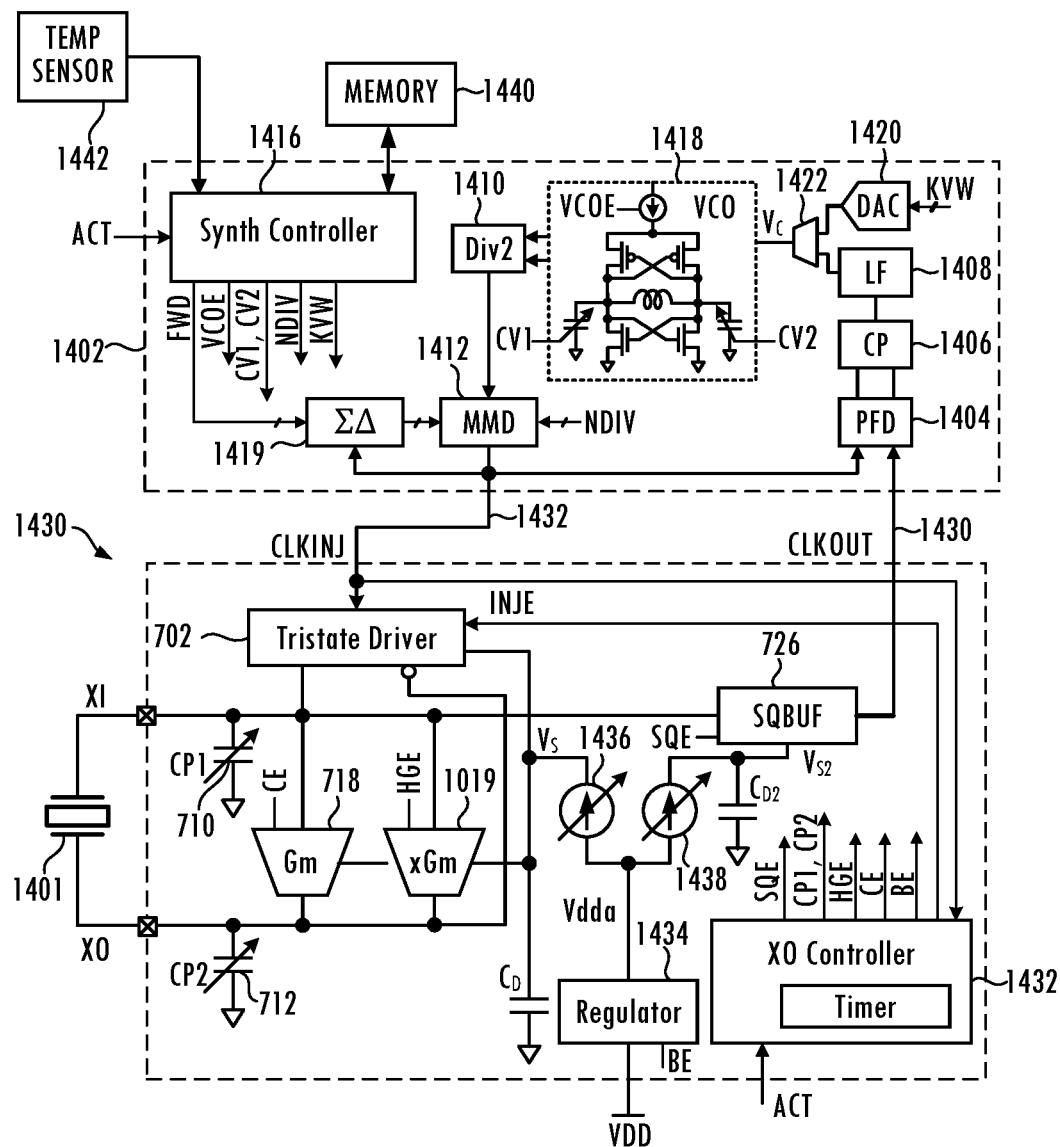
FIG. 14 illustrates a high level block diagram of a crystal oscillator and the frequency synthesizer that includes an LC oscillator, which is used during startup of the crystal oscillator.

FIG. 14 illustrates an example of a frequency synthesizer 1402 that can be used as the local oscillator 1309 in the RF communications device 1300. As shown in FIG. 14, the frequency synthesizer includes a PLL that has a phase-frequency detector (PFD) 1404, a charge-pump (CP) 1406, a loop filter (LF) 1408, a divide-by-2 (Div2) 1410, and a multi-modulus divider (MMD) 1412 that functions as a feedback divider of the PLL. The synthesizer controller 1416 controls the synthesizer and corresponds the LO controller 1321. In an embodiment, the controller 1416 includes digital logic to implement control functionality described herein. In embodiments, the control functionality also utilizes programmable logic, e.g., a microcontroller to implement some control functionality. The PLL also includes voltage controlled oscillator (VCO) 1418 implemented using an LC oscillator. The VCO 1418 is tuned using capacitors CV1 and CV2 to achieve coarse tuning and through the Vc control signal supplied by multiplexer 1422 to achieve fine tuning. The multiplexer 1422 selects the output of the loop filter 1408 in closed loop mode and selects the output of the digital to analog converter (DAC) 1420 in open loop mode for clock injection during crystal startup. If the DAC 1420 is selected, then the DAC will be used for fine tuning the VCO frequency. Instead of an analog PLL, in an embodiment the PLL is an all-digital-PLL (ADPLL) where the phase frequency detector, the charge pump, and the loop filter are replaced by a time-to-digital converter (TDC) and a digital loop filter. The analog VCO can be replaced by a digitally controlled oscillator (DCO). The DCO can simply be a VCO with a DAC to convert the digital word to a control voltage from the digital loop filter. In addition, the synthesizer 1402 includes the DAC 1420 used during crystal startup. During normal operation the crystal oscillator 1430 provides a stable clock CLKOUT 1430 at the crystal frequency ($f_{XTAL}$) and the synthesizer controller sets the synthesizer to the required settings for TX mode or RX mode. For example, the synthesizer controller supplies a frequency control word (FWD) to the ΣΔ modulator 1419 (also referred to as a ΔΣ modulator) to control the frequency of the VCO 1418 by adjusting the feedback divider. The synthesizer controller 1416 also supplies the VCO enable (VCOE) signal the tuning values CV1 and CV2 for the LC capacitor settings, and the divider value NDIV. In an embodiment the divider control for the MMD is divided into an integer portion provided by NDIV and a fractional portion provided by FWD to the ΣΔ modulator 1419. If the resolution of the DAC is good enough, the fractional portion and thus the ΣΔ modulator 1419 will not be needed during injection. During normal operation, all the synthesizer sub-blocks are enabled except the DAC 1420 can be turned off.

Figure 5:
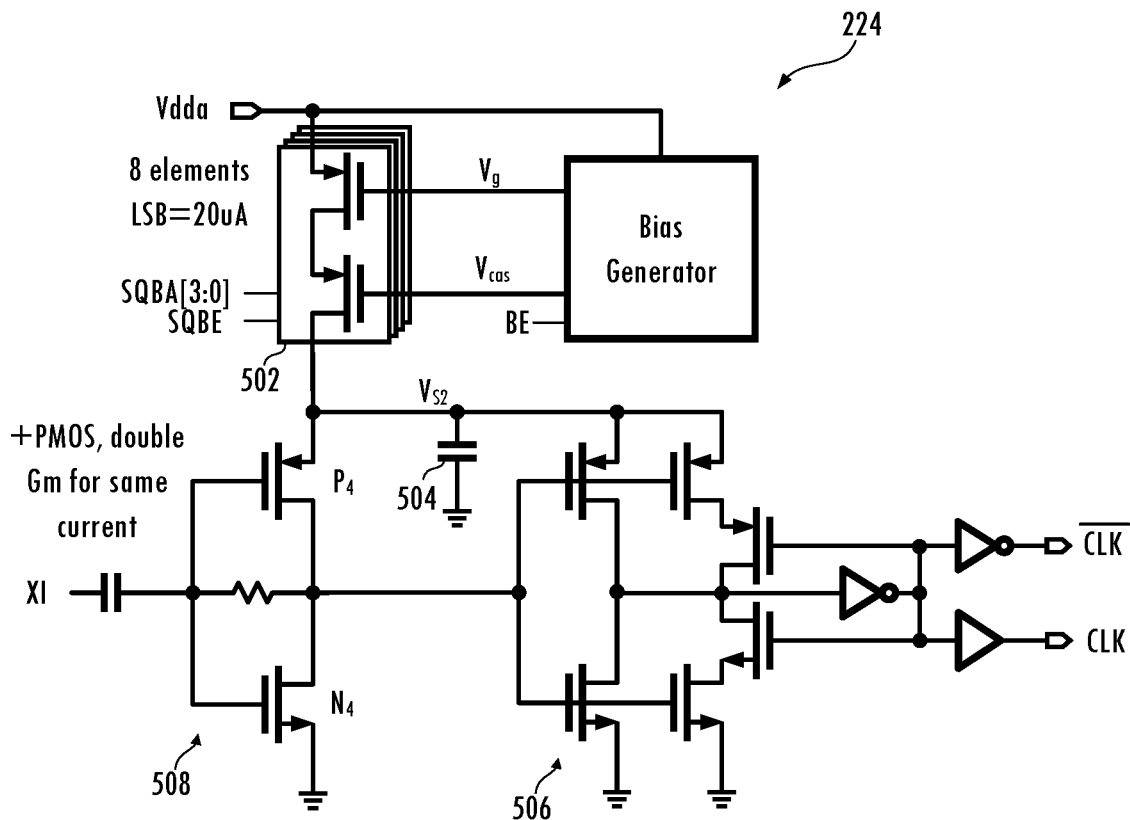
FIG. 5 illustrates an example of the squaring buffer circuit.

In an embodiment the crystal oscillator 1430 is similar to the crystal oscillator shown in FIG. 7 and similar or identical blocks are labeled with the same reference numeral. The crystal oscillator circuit 1430 includes tristate drivers 702, tuning capacitors CP1 710 and CP2 712, Gm amplifier 718, xGm amplifier 1019, the XO controller 1432, the squaring buffer 726. In addition, the crystal oscillator circuit 1430 includes the regulator 1434 corresponding in function to, e.g., the regulator 402 shown in FIG. 4, the variable current source 1436 corresponding, e.g., to the current source 414 shown in FIG. 4, and the variable current source 1438 corresponding, e.g., to the variable current source 502 shown in FIG. 5. In one embodiment the VCO 1418 sources an injection clock signal during crystal startup and the DAC 1420 sets the VCO control voltage used to generate the injection clock signal 704. Thus, the same VCO used during RF transmit/receive operations is also used for crystal startup.

The settings of crystal oscillator startup are calculated and saved when the integrated circuit is powered up for the first time. In the beginning the XO is started up without injection since the injection frequency is not set yet. Thus, the amplifiers Gm 718 and xGm 1019 are used for crystal startup for the initial power up. During initial power up operations, the settings of the VCO 1418 is calibrated by supplying CLKOUT 1430 to the PLL in the frequency synthesizer 1402 and determining the appropriate settings for KVW for DAC 1420, NDIV and/or the control word FWD for the ΣΔ modulator 1419 and NDIV to lock to the crystal frequency $f_{XTAL}$. The controller 1416 saves the calibration data in a register or other memory associated controller 1416, e.g., memory 1440. The controller saves the data along with a reading of the temperature at calibration supplied by temperature sensor 1442. In that way, the settings can be adjusted for temperature during a subsequent calibration based on any temperature change since the initial calibration.

When the integrated circuit enters sleep mode, the crystal oscillator is powered-down. As stated previously, in the initial powerup of the integrated circuit for typical IoT applications, the startup time/energy consumed is not very critical while the startup time/energy consumption becomes critical for exiting sleep mode since the integrated circuit repeatedly exits sleep mode to perform an integrated circuit operations such as RF operations (either transmitting or receiving) or other IoT functions associated with the integrated circuit. When exiting the sleep mode, the stored calibration settings for the VCO and the current temperature reading is used to set KVW (or FWD) so that CLKINJ is substantially equal to $f_{XTAL}$ (within an acceptable margin of error) so the injection contributes to startup. Note that the LC oscillator forming the VCO and the dividers (Div2 and MMD) are very fast so they will be active for injection purposes substantially only during the injection time $T_{INJ}$ with a little added time (~0.3 μs).

In a first embodiment, during crystal oscillator startup, the control values for CV1, CV2, and MMD are set at values that cause the frequency of CLKINJ to be close to the crystal frequency $f_{XTAL}$ while KVW (input digital word to the DAC) is set to mid-range. Later, KVW fine tunes the frequency to make CLKINJ closer to the frequency $f_{XTAL}$. The resolution of the tuning is determined by the number of bits of the DAC 1420. At room temperature the DAC 1420 is set close to mid-range using the KVW value to allow the DAC to compensate for both temperature increases and decreases. The phase frequency detector 1404, the charge pump 1406, and the loop filter 1408 are disabled during injection to save power and the necessary portions of the PLL are enabled and the PLL is run open loop. Similarly, in embodiments that use an ADPLL, the time-to-digital converter and digital loop filter are turned off during injection. The time of injection is usually very short $T_{INJ}$=2-3 μs.

The LC oscillator such as used in VCO 1418 has a temperature drift of, e.g., +100 ppm/° C. The DAC 1420 should adjust for the temperature drift of frequency across the desired temperature range with some margin to ensure the injection frequency is accurate. In an embodiment, a calibration loop is run periodically (e.g., every 100 wakeup events or some other appropriate interval) and uses the temperature sensor 1442 to compensate for the slope of the LC oscillator frequency with temperature to reduce the temperature drift to 20 ppm/° C. Updated DAC control values are stored in memory 1440 for each calibration loop run to ensure temperature change does not cause the clock injection frequency at crystal startup to be too far from $f_{XTAL}$, e.g., $|\delta f_{INJ}| \leq 2000$ ppm. For −40° C. to 125° C., the residual frequency drift with temperature is ±2000 ppm. The injection time $T_{INJ}$ for an embodiment with those assumptions can be calculated as:

$$|\delta f_{INJ}|T_{INJ} \leq \frac{1}{2}$$

$$|\delta f_{INJ}| \leq 2000 \; ppm$$

$$\frac{2000}{1000000} f_{XTAL} T_{INJ} \leq \frac{1}{2}$$

$$\frac{1}{500} f_{XTAL} T_{INJ} \leq \frac{1}{2}$$

$$T_{INJ} \leq \frac{1}{2} \frac{500}{f_{XTAL}}$$

$$T_{INJ} \leq \frac{250}{f_{XTAL}}$$

$$T_{INJ} \leq 250 \; T_{XTAL}$$

For $T_{XTAL}$=25 ns (40 MHz), $T_{INJ}$ should be less than 6.25 μs.

In a second embodiment, rather than setting the VCO oscillator frequency through the DAC 1420, the ΣΔ modulator 1419 sets the frequency through the multi-modulus divider 1412. In normal operation where the PLL supplies a clock signal for integrated circuit operation, e.g., in TX/RX modes, the synthesizer 1402 operates in a closed loop mode with the crystal oscillator output CLKOUT 1430 supplying the reference clock for PLL operation. During crystal oscillator startup, the frequency of the injection clock signal is set with high accuracy using the MMD 1412. The control signals NDIV, CV1, CV2 and the DAC are set to provide coarse tuning for CLKINJ. The ΣΔ modulator 1419 controls the MMD 1412 such that the frequency control word FWD sets the frequency of CLKINJ at $f_{XTAL}$. Thus, the ΣΔ modulator 1419 fine tunes the injection frequency rather than the DAC. The MMD divider division ratio changes very quickly where the average of the frequency is $f_{XTAL}$. The value of the FWD is determined at the initial power up and can be compensated for temperature in a temperature calibration that is periodically run. During crystal startup the PLL operates open loop with the loop filter, charge pump, and phase frequency detector shut down to reduce power consumption. In embodiments, the temperature is available on power up and the PLL locks to the frequency crystal oscillator frequency (frequency of CLKOUT). The values of NDIV and FWD determined at power up can be used for open loop operation such that the output of MMD is close to f XTAL. In addition, in embodiments, FWD and NDIV are compensated for temperature drift during operation. Thus, if temperature changes after power up, the accuracy of the injection frequency is still high.

Figure 15:
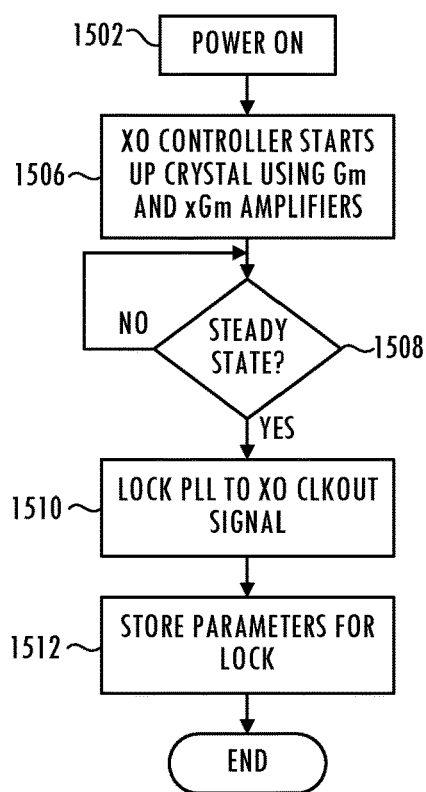
FIG. 15 is a flow chart illustrating determining parameters for injection at initial power up.

FIG. 15 is a flow chart illustrating action taken during the initial power on sequence. With reference to FIGS. 14 and 15, the power on sequence starts at 1502 when power is applied to the integrated circuit that contains the frequency synthesizer 1402 and the crystal oscillator 1430. Note that the crystal 1401 may be packaged with the integrated circuit but is a separate component. Part of the power on sequence includes crystal oscillator startup. In 1506, since the PLL has not yet been configured to supply an injection clock, the XO controller 1412 uses the Gm and xGM amplifiers to achieve sufficiently high amplitude oscillation. As mentioned previously, the startup power costs for the integrated circuit are not of great concern since IoT devices typically power up once and then go in and out of sleep states for a long time. Once the crystal oscillator reaches steady state in 1508 the synthesizer controller 1416 causes the PLL to lock to the CLKOUT signal 1430 provided by the crystal oscillator in 1510. In an embodiment, lock is achieved by varying the KVW signal to the DAC (or FWD) until the PFD indicates the phase difference is within an acceptable level. In other embodiments, frequency counters (not shown in FIG. 14) can be used and KVW (or FWD) adjusted until the frequency counters count the same value for CLKOUT 1430 and CLKINJ 1432 over the same time period. Once lock is achieved, the parameters used to achieve lock are stored in memory 1434 in step 1512. In an embodiment the memory is non-volatile memory so state is maintained when the integrated circuit goes into sleep mode. The parameters include, e.g., KVW, CV1, CV2, NDIV, FWD and any other parameters useful for recreating an injection clock signal with a frequency that matches the crystal oscillator frequency on a wake event. The particular parameters saved vary according to whether, e.g., the MMD and EA fine tune the frequency for injection or KVW fine tunes the clock frequency for injection. After the parameters are stored, the integrated circuit continues with other power on tasks if required and then typically goes into a power savings state also referred to herein as sleep mode in which the crystal oscillator is powered off.

Figure 16:
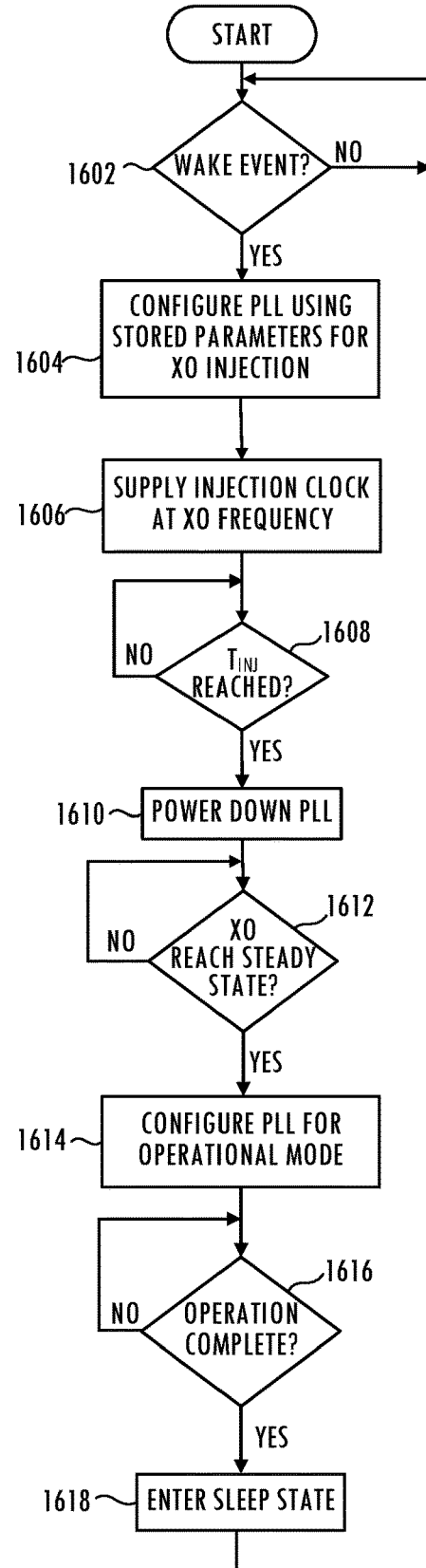
FIG. 16 is a flow chart illustrating injection of a clock signal into a crystal oscillator from a frequency synthesizer that is also used for as a local oscillator for RF communications.

FIG. 16 illustrates a flow chart for use of the frequency synthesizer 1402 for crystal startup. The synthesizer controller 1416 responds to a wake event in 1602 configuring the PLL for clock injection using the stored parameters for XO injection in 1604 and notifying the XO controller 1412 that clock injection is ready. The frequency synthesizer supplies the injection clock at the crystal oscillator frequency in 1606. The XO controller 1432 then starts up the crystal oscillator using clock injection as described e.g., in relation to FIG. 7. The XO controller checks in 1608 to see if the target time of injection (Tim) is completed, and when the injection time is complete, the synthesizer is powered down to save current consumption in 1610. Once the crystal oscillator has reached steady state in 1612, the XO controller 1432 notifies the synthesizer controller that crystal startup is complete. The synthesizer controller 1416 configures the PLL for the operational mode in 1614, e.g., for RF transmit and/or receive operations. Once the RF operation(s) complete in 1616, the IoT integrated circuit enters sleep mode again in 1618 and waits for the next wakeup event in 1602, e.g., when a next transmit and/or receive operation is due. When the next wakeup event occurs, the LC oscillator of the clock synthesizer is once again used as a source for the injection clock for crystal oscillator startup. That helps ensure that crystal oscillator startup occurs quickly and with less power in response to each wakeup event, which helps extend battery life.

Thus, embodiments to achieve faster startup with less energy use have been described. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method for starting up a crystal oscillator comprising:
   injecting a first clock signal into a first node of a crystal of the crystal oscillator during a startup phase of the starting up using a first tristate driver;
   injecting a second clock signal into a second node of the crystal during the startup phase using a second tristate driver, the first clock signal and the second clock signal being anti-phase signals;
   disabling the injecting of the first and second clock signals responsive to an end of a predetermined time period;
   enabling a first amplifier circuit coupled across the first node and the second node during the startup phase and during an intermediate phase of the starting up following the startup phase; and
   ending the intermediate phase responsive to an amplitude of a first node voltage on the first node exceeding a first voltage threshold.

2. The method as recited in claim 1 further comprising comparing an amplitude of a second node voltage on the second node to a second voltage threshold to determine if the second node voltage is greater than the second voltage threshold during the startup phase and after disabling the injecting.

3. The method as recited in claim 2 further comprising responsive to the amplitude of the second node voltage being greater than the second voltage threshold, entering the intermediate phase.

4. The method as recited in claim 2 further comprising responsive to the amplitude of the second node voltage not being greater than the second voltage threshold, turning on a second amplifier coupled across the first node and the second node prior to an end of the startup phase.

5. The method as recited in claim 4 further comprising after turning on the second amplifier, entering the intermediate phase responsive to the amplitude of the second node voltage being greater than the second voltage threshold.

6. The method as recited in claim 5 further comprising turning off the second amplifier responsive to the amplitude of the second node voltage being greater than the second voltage threshold.

7. The method as recited in claim 4 further comprising changing from comparing the amplitude of the second node voltage to the second voltage threshold during the startup phase to comparing the amplitude of the first node voltage to the first voltage threshold during the intermediate phase.

8. The method as recited in claim 1 determining an end of the startup phase responsive to the end of the predetermined time period.

9. The method as recited in claim 1 further comprising setting tuning capacitors of the crystal oscillator to steady state values for both the intermediate phase and during a steady state phase following the intermediate phase.

10. The method as recited in claim 1 further comprising responsive to the intermediate phase ending, applying steady state biasing conditions to keep the first node voltage on the first node and a second node voltage on the second node to a desired steady state condition.

11. A crystal oscillator comprising:
    an injection circuit to inject, during a startup phase for starting the crystal oscillator, a first signal into a crystal of the crystal oscillator through a first node and to inject a second signal into the crystal through a second node, the first signal and the second signal being anti-phase signals;
    a control circuit to disable the injection circuit responsive to a passage of a predetermined period of time to stop the anti-phase signals from being injected;
    a first amplifier circuit coupled across the first node and the second node and used during the startup phase and an intermediate phase; and
    a compare circuit to compare an amplitude of a first node voltage on the first node to a first voltage threshold, an end of the intermediate phase being indicated when the amplitude of the first node voltage exceeds the first threshold voltage.

12. The crystal oscillator as recited in claim 11 wherein the injection circuit further comprises:
    a first three state driver to inject the first signal into the first node; and
    a second three state driver to inject the second signal into the second node.

13. The crystal oscillator as recited in claim 12 wherein respective outputs of the first three state driver and the second three state driver are at high impedance when disabled.

14. The crystal oscillator as recited in claim 11 wherein the compare circuit compares an amplitude of a second node voltage on the second node to a second voltage threshold during the startup phase after the injection circuit is disabled.

15. The crystal oscillator as recited in claim 14 wherein responsive to the compare circuit indicating the amplitude of the second node voltage is greater than the second voltage threshold, the crystal oscillator enters the intermediate phase.

16. The crystal oscillator as recited in claim 14 further comprising:
   a second amplifier circuit; and
   wherein responsive to compare circuit indicating during the startup phase and after the injection circuit is disabled that the amplitude of the second node voltage is not greater than the second voltage threshold, turning on the second amplifier circuit.

17. The crystal oscillator as recited in claim 16 wherein after enabling the second amplifier circuit, the crystal oscillator enters the intermediate phase responsive to the amplitude of the second node voltage being greater than the second voltage threshold.

18. The crystal oscillator as recited in claim 17 wherein inputs to the compare circuit are changed responsive to the amplitude of the second node voltage exceeding the second voltage threshold to compare the amplitude of the first node voltage to the first voltage threshold to determine the end of the intermediate phase.

19. The crystal oscillator as recited in claim 11 wherein the end of the startup phase is determined responsive to the passage of the predetermined period of time.

20. The crystal oscillator as recited in claim 11 further comprising the crystal.

21. A crystal oscillator comprising:
   a first node to couple to a first terminal of a crystal of the crystal oscillator and a second node to couple to a second terminal of the crystal;
   a first three state driver to inject, during a startup phase of the crystal oscillator, a first signal into the first node;
   a second three state driver to inject, during the startup phase, a second signal into the second node, the first signal and the second signal being anti-phase signals;
   a control circuit to disable the first three state driver and the second three state driver after a predetermined period of time to thereby disable injection and cause respective outputs of the first three state driver and the second three state driver to be high impedance;
   a first amplifier circuit coupled across the first node and the second node and used during the startup phase and an intermediate phase that follows the startup phase; and
   a second amplifier circuit coupled across the first node and the second node.

22. The crystal oscillator as recited in claim 21 further comprising:
   a compare circuit to compare an amplitude of a second node voltage on the second node to a startup phase voltage threshold after the injection has been disabled, the second amplifier circuit not being turned on responsive to the amplitude of the second node voltage exceeding the startup phase voltage threshold after injection is disabled and the second amplifier circuit being turned on responsive to the amplitude of the second node voltage not exceeding the startup phase voltage threshold;
   wherein responsive to the amplitude of the second node voltage exceeding the startup phase voltage threshold after the second amplifier circuit has been turned on, the second amplifier circuit is turned off, the startup phase ends, and the intermediate phase begins; and
   wherein the compare circuit compares an amplitude of a first node voltage on the first node to an intermediate phase voltage threshold during the intermediate phase, an end of the intermediate phase and a steady state phase beginning responsive to the amplitude of the first node voltage exceeding the intermediate phase voltage threshold.

* * * * *